United States Patent
Ha et al.

(10) Patent No.: US 12,490,524 B2
(45) Date of Patent: Dec. 2, 2025

(54) SOLAR BATTERY, AND SOLAR BATTERY PANEL AND METHOD FOR MANUFACTURING SAME

(71) Applicant: JINGAO SOLAR CO., LTD, Xingtai (CN)

(72) Inventors: Jungmin Ha, Seoul (KR); Juhwa Jung, Seoul (KR); Youngsung Yang, Seoul (KR); Kyungdong Lee, Seoul (KR)

(73) Assignee: SHANGRAO XINYUAN YUEDONG TECHNOLOGY DEVELOPMENT CO. LTD, Jiangxi Province (CN)

( * ) Notice: Subject to any disclaimer, the term of this patent is extended or adjusted under 35 U.S.C. 154(b) by 177 days.

(21) Appl. No.: 17/799,765

(22) PCT Filed: Nov. 27, 2020

(86) PCT No.: PCT/KR2020/017158
§ 371 (c)(1),
(2) Date: Aug. 15, 2022

(87) PCT Pub. No.: WO2021/162216
PCT Pub. Date: Aug. 19, 2021

(65) Prior Publication Data
US 2023/0083580 A1    Mar. 16, 2023

(30) Foreign Application Priority Data

Feb. 14, 2020   (KR) .......................... 10-2020-0018540

(51) Int. Cl.
*H10F 19/90*    (2025.01)
*H10F 71/00*    (2025.01)

(52) U.S. Cl.
CPC ......... *H10F 19/906* (2025.01); *H10F 71/128* (2025.01); *H10F 19/908* (2025.01)

(58) Field of Classification Search
CPC . H01L 31/0512; H10F 19/906; H10F 19/908; H10F 71/128
See application file for complete search history.

(56) References Cited

U.S. PATENT DOCUMENTS

| 6,300,556 B1 | 10/2001 | Yamagishi et al. |
| 2008/0023069 A1 * | 1/2008 | Terada ................. H10F 19/906 |
| | | 136/256 |

(Continued)

FOREIGN PATENT DOCUMENTS

| CN | 105655010 A | 6/2016 |
| EP | 2806465 A2 | 11/2014 |

(Continued)

OTHER PUBLICATIONS

Translation of EP2806465 (Year: 2014).*

(Continued)

*Primary Examiner* — Uyen M Tran
(74) *Attorney, Agent, or Firm* — Pillsbury Winthrop Shaw Pittman LLP

(57) ABSTRACT

A solar battery according to the present embodiment has an electrode, which includes a metal and an adhesive material, formed in a conductive region including a polycrystalline semiconductor layer, and thus, the electrical characteristics of the solar battery may be improved and the manufacturing process thereof may be simplified. More specifically, the solar battery includes a semiconductor substrate, and the conductive region including the polycrystalline semiconductor layer is positioned on one surface of the semiconductor substrate.

14 Claims, 15 Drawing Sheets

(56) References Cited

U.S. PATENT DOCUMENTS

| | | | |
|---|---|---|---|
| 2012/0142140 A1 | 6/2012 | Li et al. | |
| 2013/0298988 A1 | 11/2013 | Fukuda et al. | |
| 2015/0090325 A1 | 4/2015 | Sewell et al. | |
| 2015/0144183 A1* | 5/2015 | Yang | H01L 31/0747 438/57 |
| 2015/0380578 A1 | 12/2015 | Zhu | |
| 2016/0005905 A1* | 1/2016 | Jang | H01L 31/0504 136/244 |
| 2019/0304619 A1 | 10/2019 | Zhang et al. | |

FOREIGN PATENT DOCUMENTS

| | | | |
|---|---|---|---|
| JP | H0715022 A | 1/1995 | |
| JP | 2007141967 A | 6/2007 | |
| JP | 2010010620 A | 1/2010 | |
| JP | 2011066071 A | 3/2011 | |
| JP | 2014123692 A | 7/2014 | |
| JP | 2014208882 A | 11/2014 | |
| JP | 2014229904 A | 12/2014 | |
| JP | 2017022380 A | 1/2017 | |
| JP | 2017028292 A | 2/2017 | |
| JP | 2017174926 A | 9/2017 | |
| JP | 2018141180 A | 9/2018 | |
| KR | 10-2014-0136562 A | 12/2014 | |
| KR | 10-2016-0010179 A | 1/2016 | |
| KR | 10-2016-0041649 A | 4/2016 | |
| KR | 20160063861 A | 6/2016 | |
| KR | 10-2017-0057231 A | 5/2017 | |
| KR | 101975586 B1 | 8/2019 | |
| WO | 2011001837 A | 1/2011 | |

OTHER PUBLICATIONS

Extended European Search Report dated Jan. 22, 2024 for related application No. 20918260.9 (PCT/KR2020017158).

Indian Office Action dated Mar. 22, 2023 for related application No. 202217051759.

Japanese Office Action dated Dec. 5, 2023 for related application No. 2022-548970.

Japanese Patent Application No. 2022-548970, Office Action—Notice of Reasons for Refusal date of drafting Aug. 21, 2023.

AU Office Action for Application No. 2023274104 dated Nov. 14, 2024, pp. 1-6.

* cited by examiner

SOLAR BATTERY, AND SOLAR BATTERY PANEL AND METHOD FOR MANUFACTURING SAME

CROSS REFERENCE TO RELATED APPLICATIONS

This application is the National Phase of PCT International Application No. PCT/KR2020/017158, filed on Nov. 27, 2020, which claims priority under 35 U.S.C. 119(a) to Patent Application No. 10-2020-0018540, filed in the Republic of Korea on Feb. 14, 2020, all of which are hereby expressly incorporated by reference into the present application.

TECHNICAL FIELD

The present disclosure relates to a solar battery, a solar battery panel, and a method for manufacturing the same, and more particularly, to a solar battery having an improved structure, and a solar battery panel including the same, and a method for manufacturing the same.

BACKGROUND ART

A solar battery may be manufactured by forming various layers and electrodes according to design. Depending on the design of various layers and electrodes, the characteristics and productivity of the solar battery may vary. In particular, when the materials of the electrode, the formation process, etc., are changed, the characteristics and productivity of the solar battery may be greatly changed.

For example, as disclosed in Korean Patent No. 1541422, when the electrode is formed using plating, manufacturing cost is high, and it is difficult to precisely control the plating process conditions, so problems such as poor plating and deterioration in contact properties may occur. Since it is necessary to form a separate seed layer for plating, the manufacturing process of the solar battery is very complicated.

As another example, when the electrode is formed using a sputtering process, a protective film (resist) is formed by a printing process after forming a sputtering electrode including a metal film by the sputtering process, and a portion of a metal film is removed by a wet etching process to form an electrode. As a result, damage to the solar battery may occur due to the sputtering process, the etching process, etc., the process is complicated due to the need to perform several steps, and the probability of occurrence of defects in each process increases. In addition, since a thickness of the sputtering electrode is thin, and thus, the resistivity characteristics are not sufficient, an additional electrode layer is formed or a plurality of metal layers are stacked, so there is a problem in that the manufacturing cost increases and the manufacturing process is complicated.

DISCLOSURE

Technical Problem

The present embodiment is intended to provide a solar battery capable of improving productivity and reliability, a solar battery panel, and a method for manufacturing the same.

More specifically, the present embodiment provides a solar battery capable of improving electrical characteristics of the solar battery by improving an electrode structure of the solar battery and simplifying a manufacturing process of the solar battery.

In addition, the present embodiment provides a solar battery panel capable of simplifying a structure and a manufacturing process while improving electrode and wiring material attachment properties by improving a structure and process of attaching the electrode and the wiring material of the solar battery, and a method for manufacturing the same.

Technical Solution

According to the present embodiment, a solar battery has an electrode, which includes a metal and an adhesive material, formed in a conductive region including a polycrystalline semiconductor layer, and thus, the electrical characteristics of the solar battery may be improved and the manufacturing process thereof may be simplified. More specifically, the solar battery includes a semiconductor substrate, and the conductive region including the polycrystalline semiconductor layer is positioned on one surface of the semiconductor substrate.

More specifically, the metal included in the electrode may include a first metal that reacts with a semiconductor material included in the polycrystalline semiconductor layer to form a compound layer including a metal-semiconductor compound. The compound layer may be partially formed to correspond to a first region at a boundary between the electrode and the conductive region, and the electrode may have excellent resistance and contact properties by the compound layer.

The metal and the adhesive material may be formed in contact with the polycrystalline semiconductor layer in the second region excluding the first region at the boundary between the electrode and the conductive region.

For example, the first metal may include nickel, the semiconductor material may include silicon, and the compound layer may include nickel silicide.

In the present embodiment, an area of the first region may be smaller than that of the second region.

In the present embodiment, the metal of the electrode may further include a second metal having a lower resistivity than the first metal to improve resistance characteristics. For example, a part by weight of the first metal may be 15 or less based on total 100 parts by weight of the metal in the electrode.

In the present embodiment, since the electrode includes a single printed layer including the metal and the adhesive material, it is possible to simplify the manufacturing process of the solar battery. For example, a thickness of the electrode or the printed layer may be 10 µm or more.

For example, the solar battery further includes a back surface passivation film covering the conductive region and having a contact hole, in which the electrode may be formed inside the contact hole to be spaced apart from the back surface passivation film. Alternatively, the solar battery may further include a back surface passivation film positioned on the polycrystalline semiconductor layer and on at least a portion of at least one of the first and second electrodes.

According to the present embodiment, the solar battery may have a back surface electrode structure. For example, the conductive region may include a first conductive region and a second conductive region spaced apart from each other on the one surface of the semiconductor substrate, the electrode may include a first electrode connected to the first conductive region and a second electrode connected to the second conductive region, and at least one of the first and second electrodes may include the metal and the adhesive material.

According to the present embodiment, a solar battery panel includes the above-described solar battery, a wiring material electrically connected to the electrode of the above-described solar battery, and an adhesive layer positioned between the electrode and the wiring material to electrically connect the electrode and the wiring material.

Here, the adhesive layer is formed in contact with the electrode, and may be a low-temperature solder paste including a solder material including bismuth. A surface roughness of the electrode may be greater than that of the adhesive layer. The electrode may protrude to be rounded or convexed toward the wiring material, and a width of the adhesive layer may gradually increase toward the wiring material while completely covering the rounded portion of the electrode. A ratio of the thickness of the electrode to the thickness of the adhesive layer may be 0.5 or more.

According to the present embodiment, a method for manufacturing a solar battery panel includes a step of manufacturing the above-described solar battery, a step of forming an adhesive layer on an electrode of the above-described solar battery, and an adhesive heat treatment step of applying heat and pressure to a wiring material positioned on the electrode and the adhesive layer to adhere the wiring material to the electrode using the adhesive layer. In this case, the electrode may include a printed layer formed by applying an electrode paste including a metal and an adhesive material through a printing process and performing curing heat treatment on the electrode paste.

Here, the electrode may include a single printed layer formed by a one-time printing process, and the adhesive layer may be formed by applying a solder paste including a solder material including bismuth on the single printed layer.

For example, the adhesive layer may further include an additional adhesive material. In this case, before the adhesive heat treatment step, a part by weight of the adhesive material included in the electrode paste may be smaller than that of the additional adhesive material included in the solder paste, and after the adhesive heat treatment step, a part by weight of the adhesive material included in the electrode may be greater than that of the additional adhesive material included in the adhesive layer. A temperature of the curing heat treatment step of the electrode may be 500° C., or lower, and a melting point of the adhesive layer may be lower than a process temperature of the adhesive heat treatment step.

Advantageous Effects

According to the present embodiment, an electrode including a printed layer using a low-temperature electrode paste including a metal and an adhesive material is formed in a conductive region including a polycrystalline semiconductor layer, so excellent adhesive properties due to the adhesive material, excellent carrier mobility of a polycrystalline semiconductor layer, and excellent resistance and adhesive properties due to a sufficient thickness of an electrode may be obtained. Here, the metal is combined with a semiconductor material of the polycrystalline semiconductor layer, and includes a first metal forming a compound layer and a second metal having a relatively low resistance, so excellent resistance and contact properties may be obtained by the compound layer formed by the first metal, and resistance characteristics may be further improved by the low resistance of the second metal. As a result, it is possible to improve the characteristics and efficiency of the solar battery.

For example, the electrode includes a single printed layer to simplify the process of forming the electrode, so the number of processes may be reduced and the defect rate may be improved, thereby improving the productivity of the solar battery. By applying the low-temperature electrode paste to the polycrystalline semiconductor layer, it is possible to prevent damage caused by heat that may occur in high-temperature processes. In addition, since a wiring material may be attached by forming an adhesive layer made of low-temperature solder paste on a single printed layer, it is possible to improve productivity of a solar battery panel. As a result, it is possible to improve productivity and reliability of a solar battery and a solar battery panel including the same.

MODE FOR DISCLOSURE

Figure 1:
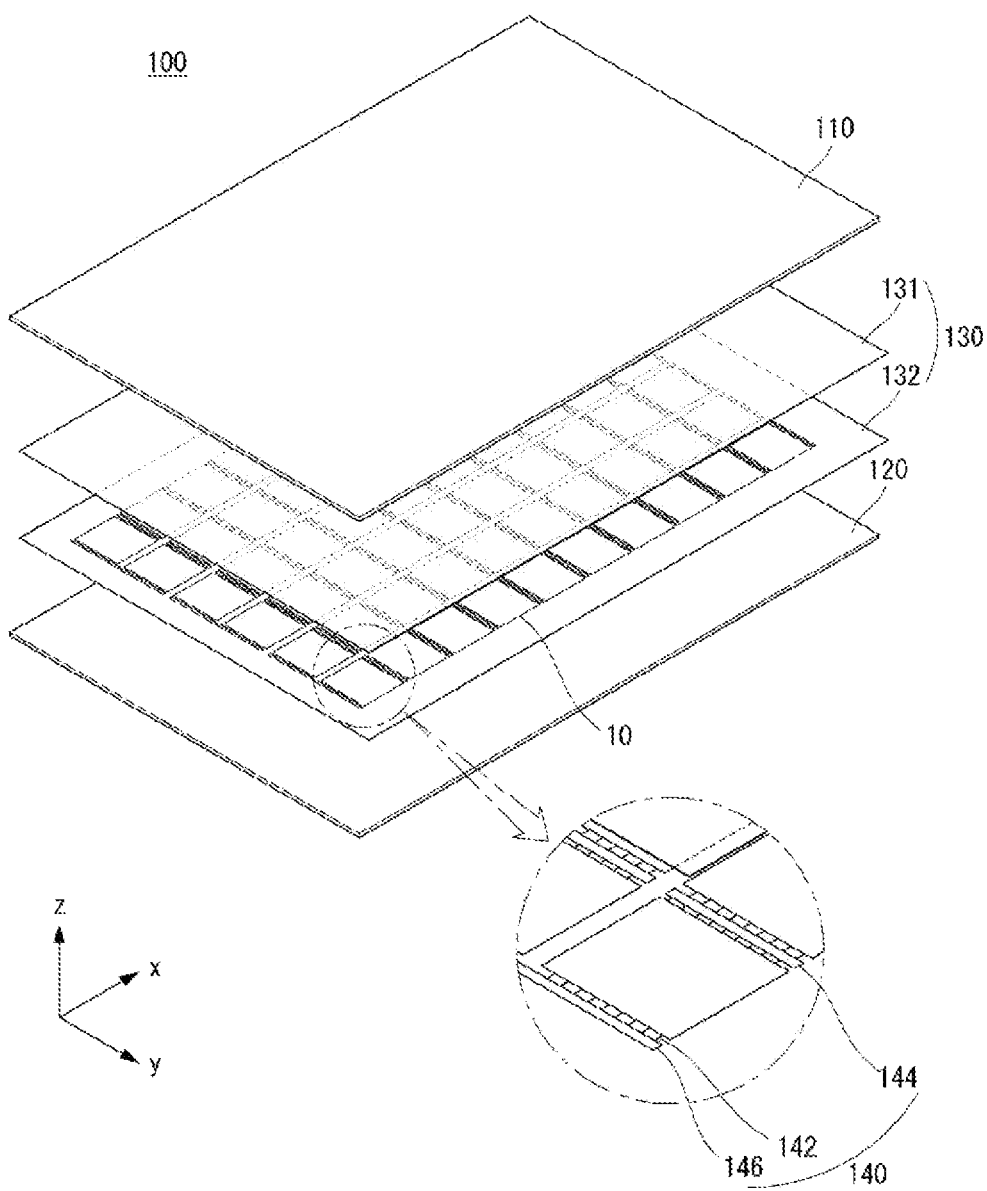
FIG. 1 is an exploded perspective view schematically illustrating a solar battery panel according to an embodiment of the present disclosure.

Hereinafter, embodiments of the present disclosure will be described in detail with reference to the accompanying drawings. However, it goes without saying that the present disclosure is not limited to these embodiments and may be modified in various forms.

In the drawings, in order to clearly and briefly describe the present disclosure, the illustration of parts irrelevant to the description is omitted, and the same reference numerals are used for the same or extremely similar parts throughout the specification. In addition, in the drawings, a thickness, a width, etc., are enlarged or reduced in order to make the description more clear, and the thickness, the width, etc., of the present disclosure are not limited to those illustrated in the drawings.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Hereinafter, a solar battery, a solar battery panel, and a method for manufacturing the same according to an embodiment of the present disclosure will be described in detail with reference to the accompanying drawings. In the present specification, expressions such as "first" and "second" are used to distinguish each other, and the present disclosure is not limited thereto.

Figure 2:
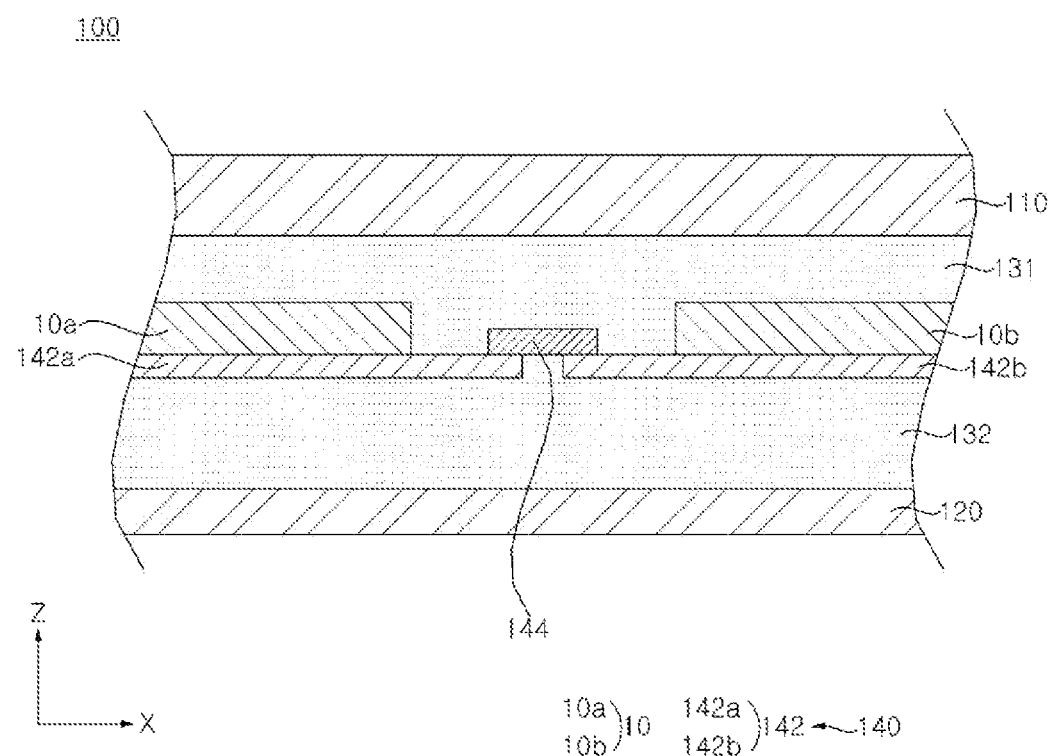
FIG. 2 is a partial cross-sectional view conceptually illustrating first and second solar batteries included in the solar battery panel illustrated in FIG. 1 and a wiring unit connecting these first and second solar batteries.

FIG. 1 is an exploded perspective view schematically illustrating a solar battery panel 100 according to an embodiment of the present disclosure, and FIG. 2 is a partial cross-sectional view conceptually illustrating first and second solar batteries 10a and 10b included in the solar battery panel 100 illustrated in FIG. 1, and a wiring unit 140 connecting these first and second solar batteries. In this specification, for clarity of description, two solar batteries 10 adjacent to each other are referred to as a first solar battery 10a and a second solar battery 10b.

Referring to FIGS. 1 and 2, the solar battery panel 100 according to the present embodiment includes a solar battery 10 and a wiring unit 140 electrically connected to the solar battery 10, and may include an adhesive layer (reference numeral LSP in FIG. 4, hereinafter the same) electrically connecting the solar battery 10 and the wiring unit 140 between the solar battery 10 and the wiring unit 140 (more specifically, the electrodes (reference numerals 42 and 44 in FIG. 4, hereinafter the same) of the solar battery 10 and a wiring material 142). In addition, the solar battery panel 100 has a sealing material 130 surrounding and sealing the solar battery 10 and the wiring unit 140, a first cover member 110 positioned on one surface (e.g., a front side) of the solar battery 10 on the sealing material 130, and a second cover member 120 positioned on the other surface (e.g., a back surface) of the solar battery 10 on the sealing material 130.

First, the solar battery 10 may include a semiconductor substrate (reference numeral 12 in FIG. 4, hereinafter the same) and first and second electrodes 42 and 44 positioned on one surface (e.g., a back surface) of the semiconductor substrate 12. The solar battery 10 will be described in detail later.

In the present embodiment, the solar battery panel 100 includes a plurality of solar batteries 10, and the plurality of solar batteries 10 may be electrically connected in series, in parallel, or in series-parallel by the wiring unit 140.

More specifically, at least a portion of the wiring unit 140 may include the wiring material 142 that overlaps with the first and second electrodes 42 and 44 of the solar battery 10 and is connected to the first and second electrodes 42 and 44. A connection structure or the like of each solar battery 10 and the wiring material 142 will be described in more detail later. For example, the wiring unit 140 may further include a connection wiring 144 that is positioned between the solar batteries 10 in a direction intersecting the wiring material 142 and is connected to the wiring material 142. The plurality of solar batteries 10 may be connected in one direction (x-axis direction in the drawing) by the wiring material 142 and the connection wiring 144 to form one column (i.e., a solar battery string). In addition, the wiring unit 140 may further include a bus bar wiring 146 that is positioned at both ends of the solar battery string and is connected to another solar battery string or a junction box (not illustrated).

The wiring material 142, the connection wiring 144, and the bus bar wiring 146 may each include a conductive material (e.g., a metal material). For example, the wiring material 142, the connection wiring 144, or the bus bar wiring 146 may include a conductive core (reference numeral 1420 in FIG. 4, hereinafter the same) and a conductive coating layer (reference numeral 1422 in FIG. 4, hereinafter the same) that is positioned on a surface of the conductive core 1420 and includes a solder material. Here, the conductive core 1420 may include any one of gold (Au), silver (Ag), copper (Cu), or aluminum (Al), and the conductive coating layer 1422 or the solder material may be made of tin (Sn) or an alloy including the tin. For example, the conductive core 1420 may include or be made of copper, and the conductive coating layer 1422 may be made of an alloy (e.g., SnBiAg) including tin.

However, the present disclosure is not limited thereto, and the material, shape, connection structure, or the like of the wiring material 142, the connection wiring 144, or the bus bar wiring 146 may be variously modified. For example, the solar battery string may be formed by connecting adjacent solar batteries 10 only with the wiring material 142 without separately including the connection wiring 144.

The sealing material 130 may include a first sealing material 131 positioned on the front surface of the solar battery 10 connected by the wiring unit 140 and a second sealing material 132 positioned on the back surface of the solar battery 10. The first sealing material 131 and the second sealing material 132 prevent moisture and oxygen from being introduced and chemically combine elements of the solar battery panel 100. The first and second sealing materials 131 and 132 may be made of an insulating material having light transmittance and adhesion. For example, an ethylene vinyl acetate copolymer resin (EVA), polyvinyl butyral, a silicon resin, an ester-based resin, an olefin-based resin, etc., may be used as the first sealing material 131 and the second sealing material 132. The second cover member 120, the second sealing material 132, the solar battery 10, the wiring unit 140, and the first sealing material 131, and the first cover member 110 may be integrated by a lamination process using the first and second sealing materials 131 and 132, etc., to constitute the solar battery panel 100. Although the drawings illustrates that the first sealing material 131 and the second sealing material 132 are positioned separately from each other, in reality, the first sealing material 131 and the second sealing material 132 may be integrated without a boundary by being integrated by the lamination process.

The first cover member 110 is positioned on the first encapsulant 131 to form the front surface of the solar battery panel 100, and the second cover member 120 is positioned on the second encapsulant 132 to form the back surface of the solar battery panel 100. Each of the first cover member 110 and the second cover member 120 may be made of an insulating material capable of protecting the solar battery 10 from external impact, moisture, ultraviolet rays, and the like. In addition, the first cover member 110 is made of a light transmittance material that may transmit light, and the second cover member 120 may be formed of a sheet made of a light transmittance material, a non-light transmittance material, a reflective material, or the like. For example, the first cover member 110 may be composed of a glass substrate or the like, and the second cover member 120 may be composed of a film, a sheet, a glass substrate, or the like. For example, the second cover member 120 has a Tedlar/PET/Tedlar (TPT) type, or may include poly vinylidene fluoride (PVDF) resin layer formed on at least one surface of a base film (e.g., polyethylene terephthalate (PET)).

However, the present disclosure is not limited thereto. Accordingly, the first and second sealing materials 131 and 132, the first cover member 110, or the second cover member 120 may include various materials other than those described above and may have various shapes. For example, the first cover member 110 or the second cover member 120 may have various shapes (e.g., a substrate, a film, a sheet, etc.) or materials.

Figure 3:
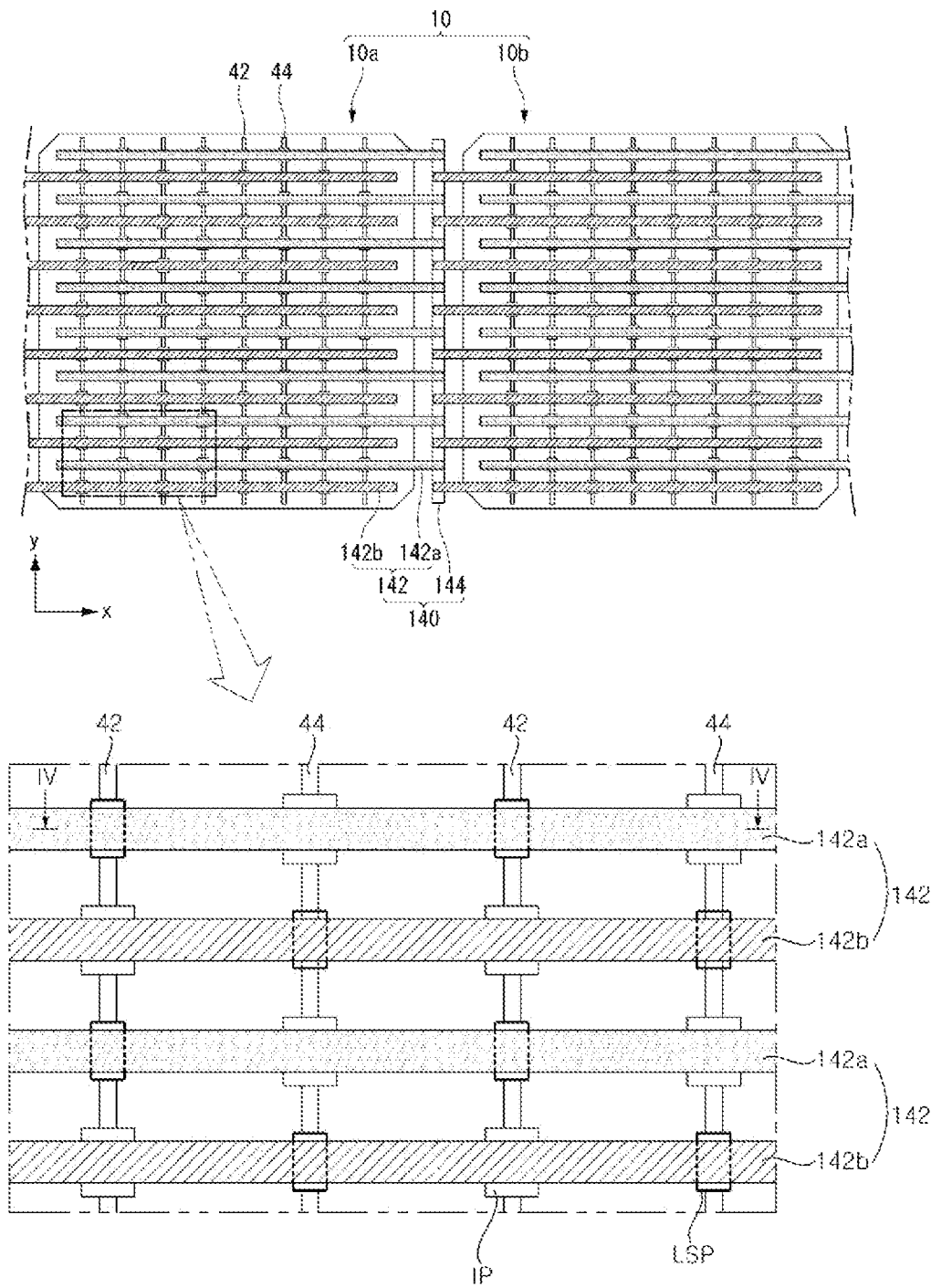
FIG. 3 is a rear plan view schematically illustrating the first and second solar batteries, an adhesive layer and an insulating member, and a wiring unit included in the solar battery panel illustrated in FIG. 1.
Figure 4:
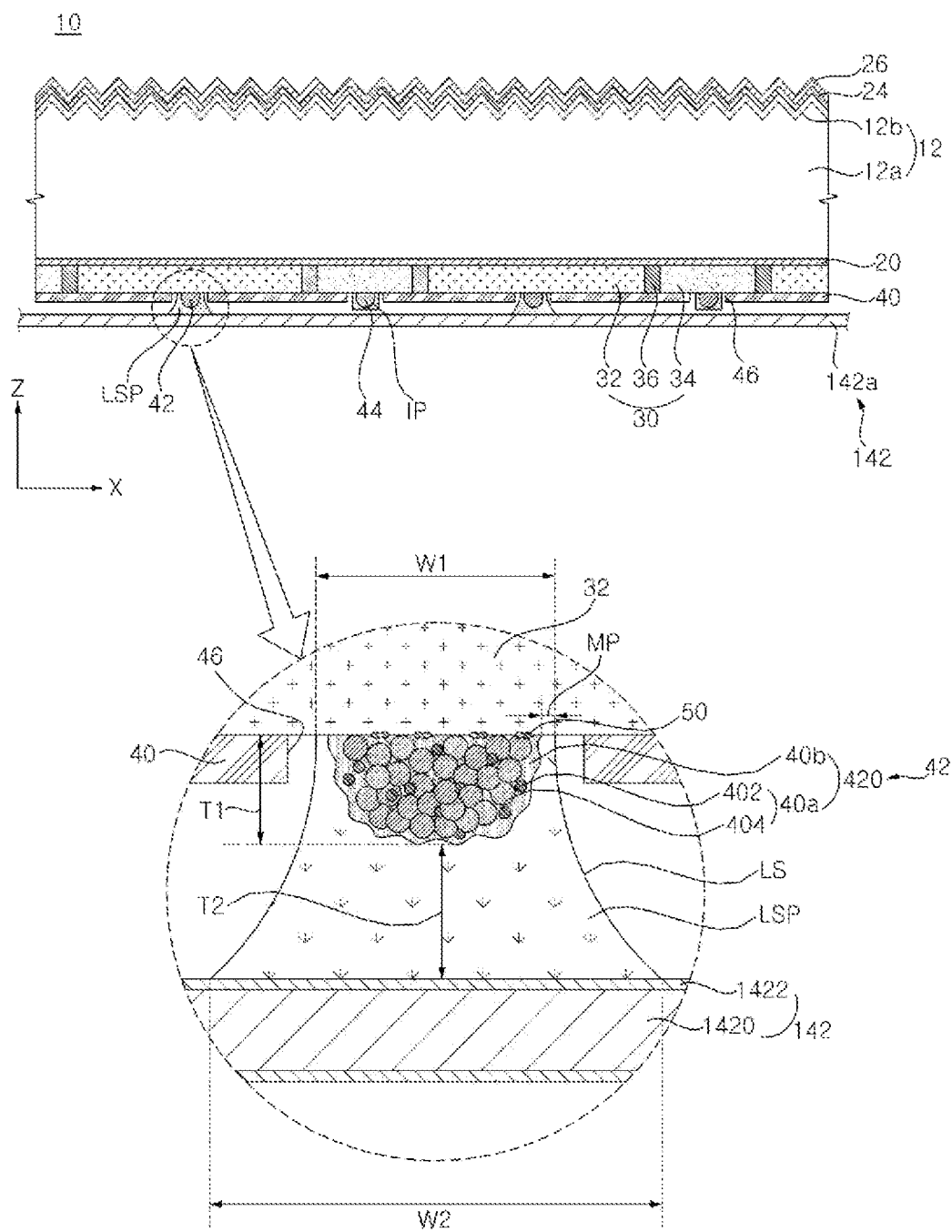
FIG. 4 is a cross-sectional view taken along line IV-IV of FIG. 3.
Figure 5:
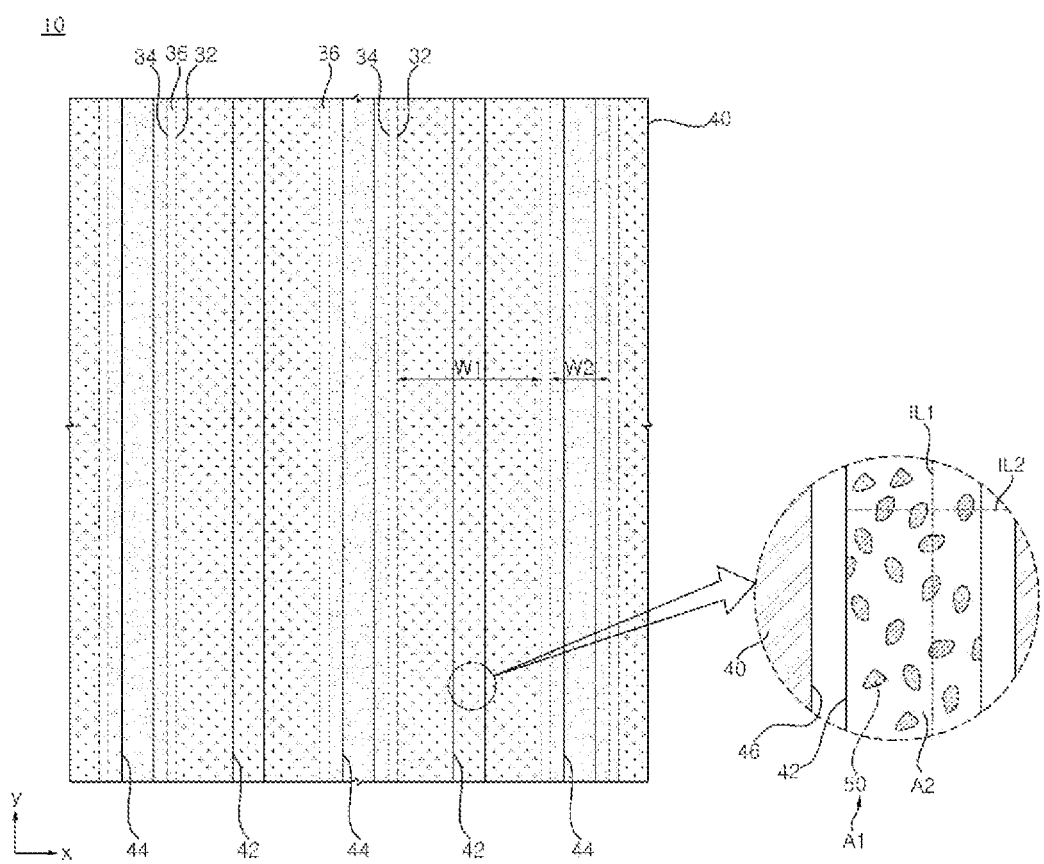
FIG. 5 is a partial rear plan view illustrating a back surface of a solar battery included in the solar battery panel illustrated in FIG. 1.

FIG. 3 is a rear plan view schematically illustrating first and second solar batteries 10a and 10b, an adhesive layer LSP and an insulating member IP, and the wiring unit 140 included in the solar battery panel 100 illustrated in FIG. 1. FIG. 4 is a cross-sectional view taken along line IV-IV of FIG. 3. FIG. 5 is a partial back surface plan view illustrating the back surface of the solar battery 10 included in the solar battery panel 100 illustrated in FIG. 1. For clarity of understanding, an enlarged circle of FIG. 5 mainly illustrates a compound layer 50 formed at the boundary between the conductive regions 32 and 34 and the electrodes 42 and 44.

First, after the solar battery 10 according to the present embodiment is described in detail, the adhesive layer LSP and the insulating member IP connected to the solar battery 10, and the wiring unit 140 will be described in detail.

Referring to FIGS. 3 to 5, the solar battery 10 according to the present embodiment includes a semiconductor substrate 12, conductive regions 32 and 34 that are positioned on one surface (e.g., a back surface) of the semiconductor 12 and includes a polycrystalline semiconductor layer 30, and electrodes 42 and 44 that are connected to the conductive regions 32 and 34 and include a metal 40a and an adhesive material 40b.

In the present embodiment, the conductive regions 32 and 34 may include a first conductive region 32 and a second conductive region 32 spaced apart from each other on the back surface of the semiconductor substrate 12, and the electrodes 42 and 44 may include a first electrode 42 connected to the first conductive region 32 and a second electrode 44 connected to the second conductive region 34. In this case, at least one of the first and second electrodes 42 and 44 may be an electrode including the metal 40a and the adhesive material 40b as described above. As described above, in the present embodiment, the solar battery 10 may have a back surface electrode structure in which the first and second conductive regions 32 and 34 having first and second conductivity types opposite to each other are positioned together on the back surface of the semiconductor substrate 12 while being spaced apart from each other, and the first and second electrodes 42 and 433 are positioned together thereon. Then, since the electrode is not formed on the front surface of the semiconductor substrate 12, it is possible to improve the efficiency of the solar battery 10 by minimizing shading loss. However, the present disclosure is not limited thereto, and various modifications are possible, such as at least one of the first and second conductive regions 32 and 34 being positioned on the front surface of the semiconductor substrate 12.

For example, the semiconductor substrate 12 may include a base region 12a made of a crystalline semiconductor (e.g., single crystal or polycrystalline semiconductor, for example, single crystal or polycrystalline silicon, particularly single crystal silicon) including a first or second conductive dopant. As described above, the solar battery 10 based on the base region 12a or the semiconductor substrate 12 having few defects due to high crystallinity has excellent electrical characteristics.

A front electric field region 12b may be positioned on the front surface of the semiconductor substrate 12. For example, the front electric field region 12b is a doped region having the same conductivity type as that of the base region 12a and a higher doping concentration than the base region 12a, and may constitute a portion of the semiconductor substrate 12. However, the present disclosure is not limited thereto. Accordingly, various modifications are possible, such as the front electric field region 12b being a semiconductor layer positioned separately from the semiconductor substrate 12 or including an oxide film having no dopant and having a fixed electric charge.

In addition, the front surface of the semiconductor substrate 12 may be provided with an anti-reflection structure for preventing reflection (for example, a pyramid-shaped texturing structure including a (111) surface of the semiconductor substrate 12) to minimize reflection. In addition, the back surface of the semiconductor substrate 12 includes a mirror-polished surface and has a smaller surface roughness than the front surface to improve passivation characteristics. However, the present disclosure is not limited thereto. For example, various modifications are possible, such as an anti-reflection structure formed on the back surface of the semiconductor substrate 12 or no anti-reflection structure formed on the front surface of the semiconductor substrate 12.

An intermediate layer 20 may be positioned between the semiconductor substrate 12 and the conductive regions 32 and 34 on the back surface of the semiconductor substrate 12. The intermediate layer 20 may be entirely positioned on the back surface of the semiconductor substrate 12, and for example, may entirely contact the back surface of the semiconductor substrate 12.

The intermediate layer 20 may serve as a passivation film for passivating the surface of the semiconductor substrate 12. Alternatively, the intermediate layer 20 may serve as a dopant control role or a diffusion barrier preventing the dopants of the conductive regions 32 and 34 from being excessively diffused into the semiconductor substrate 12. The intermediate layer 20 may include various materials capable of performing the above-described roles, and may be formed of, for example, an oxide film, a dielectric film or insulating film containing silicon, a nitride oxide film, a carbide oxide film, an intrinsic amorphous silicon film, etc. As in the present embodiment, in the case where the conductive regions 32 and 34 includes the polycrystalline semiconductor layer 30, when the intermediate layer 20 is formed of a silicon oxide film, the intermediate layer 20 may be easily manufactured and carriers may be smoothly performed through the intermediate layer 20. As another example, when the conductive regions 32 and 34 are formed of an amorphous semiconductor layer or a microcrystalline semiconductor layer, the intermediate layer 20 may be formed of an intrinsic amorphous silicon layer.

A thickness of the intermediate layer 20 may be smaller than that of a front passivation film 24, an anti-reflection film 26, and a back surface passivation film 40. For example, the thickness of the interlayer 20 may be 10 nm or less (e.g., 5 nm or less, more specifically, 2 nm or less, for example, 0.5 nm to 2 nm). This is for sufficiently realizing the effect of the interlayer 20, but the present disclosure is not limited thereto.

The polycrystalline semiconductor layer 30 including the conductive regions 32 and 34 may be positioned (e.g., contacted) on the interlayer 20. More specifically, the first conductive region 32 and the second conductive region 34 may be positioned together in the polycrystalline semiconductor layer 30 continuously formed on the intermediate layer 20, and thus, may be positioned on the same plane. In addition, a barrier region 36 may be positioned between the first conductive region 32 and the second conductive region 34 and on the same plane as the first conductive region 32 and the second conductive region 34.

The first and second conductive regions 32 and 34 and the barrier region 36, or the polycrystalline semiconductor layer 30 may be made of polycrystalline semiconductors (e.g., polycrystalline silicon) having a polycrystalline structure that is a crystal structure different from that of the semiconductor substrate 12. More specifically, the first conductive region 32 may include a part (a first conductive polycrystalline part) of the polycrystalline semiconductor layer 30 containing a first conductive dopant, the second conductive region 34 may include a part (a second conductive polycrystalline part) of the polycrystalline semiconductor layer 30 containing a second conductive dopant, and the barrier region 36 may include a part (intrinsic or undoped polycrystalline part) of the polycrystalline semiconductor layer 30 undoped with dopants of the first and second conductivity types. As described above, when the first and second conductive regions 32 and 34 include the polycrystalline semiconductor layer 30, the first and second conductive regions 32 and 34 may have high carrier mobility. In addition, as in the present embodiment, the first and second conductive regions 32 and 34 are combined with the electrodes 42 and 44 including a single printed layer 420, thereby improving various characteristics of the solar battery 10. However, the present disclosure is not limited thereto. Accordingly, the first and second conductive regions 32 and 34 and the barrier region 36 or the polycrystalline semiconductor layer 30 may include an amorphous semiconductor, a microcrystalline semiconductor (e.g., amorphous silicon or microcrystalline silicon), or the like.

In this case, when the base region 12*a* has the second conductivity type, the first conductive region 32 having a conductivity type different from that of the base region 12*a* functions as an emitter region, and the second conductive region 34 having the same conductivity type as the base region 12*a* functions as a back surface field region. The barrier region 36 physically separates the first conductive region 32 and the second conductive region 34 from each other to prevent a shunt that may occur when they come into contact.

In this way, the first and second conductive regions 32 and 34 are formed of separate layers different from the semiconductor substrate 12 with the intermediate layer 20 interposed therebetween. Accordingly, loss due to recombination may be minimized compared to the case where the doped region formed by doping the semiconductor substrate 12 with a dopant is used as the conductive region. In addition, by configuring the barrier region 36 as an intrinsic or undoped portion, the process of forming the barrier region 36 may be simplified.

However, the present disclosure is not limited thereto. Therefore, the intermediate layer 20 may not be provided. Alternatively, at least one of the first and second conductive regions 32 and 34 may be formed by doping a portion of the semiconductor substrate 12 with a dopant to form a doped region constituting a portion of the semiconductor substrate 12. In addition, the barrier region 36 may not be provided, or the barrier region 36 may be made of a material other than a semiconductor material or may be formed of an empty space. Various other modifications are possible.

Here, when the first or second conductive dopant is p-type, a group III element such as boron (B), aluminum (Al), gallium (Ga), or indium (In) may be used. When the first or second conductive dopant is n-type, a group 5 element such as phosphorus (P), arsenic (As), bismuth (Bi), or antimony (Sb) may be used. For example, one of the first and second conductive dopant may be boron (B) and the other may be phosphorus (P).

In the present embodiment, the first conductive region 32 extends in a first direction (y-axis direction in the drawing) and is provided in plurality in a second direction (x-axis direction in the drawing) to form a stripe shape, and the second conductive region 34 may extend in the first direction and may be provided in plurality in the second direction to form a stripe shape. In the second direction, the first conductive region 32 and the second conductive region 34 may be positioned alternately with each other, and may be positioned between the first conductive region 32 and the second conductive region 34 with a barrier region 36 separating them. In this case, an area (e.g., width) of the first conductive region 32 may be larger than that (e.g., width) of the second conductive region 34. As a result, the first conductive region 32 functioning as an emitter region may have a larger area than the second conductive region 34 functioning as the back surface electric field region, and thus, may be advantageous for photoelectric conversion. However, the present disclosure is not limited thereto, and the arrangement, area, and width of the first and second conductive regions 32 and 34 and the harrier region 36 may be variously modified.

The front passivation film 24 and the anti-reflection film 26 may be sequentially positioned (e.g., contacted) on the front surface of the semiconductor substrate 12, and the back surface passivation film 40 having a contact hole 46 on the conductive regions 32 and 34 or the polycrystalline semiconductor layer 30 may be positioned (e.g., contacted). The front passivation film 24 and the anti-reflection film 26 are entirely formed on the entire surface of the semiconductor substrate 12, and the back surface passivation film 40 may be entirely formed on the polycrystalline semiconductor layer 30, except for the contact hole 46. For example, the front passivation film 24, the antireflection layer 26, or the back surface passivation film 40 may not include a dopant or the like to have excellent insulating properties and passivation properties.

For example, the front passivation film 24, the anti-reflection film 26, or the back surface passivation film 40 may have a single layer or multilayer structure, in which two or more layers are combined, selected from the group consisting of a silicon nitride film, a silicon nitride film containing hydrogen, a silicon oxide film, a silicon oxynitride film, an aluminum oxide film, a silicon carbide film, $MgF_2$, $ZnS$, $TiO_2$, and $CeO_2$ In the present embodiment, the back surface passivation film 40 may be formed of an optical film that controls an optical path, such as a reflective film and an anti-reflection film. For example, the back surface passivation film 40 may function as the reflective film serving as an internal reflection that reflects light incident on the front surface of the solar battery 10 and reaching the back surface back into the solar battery 10. In addition, the back surface passivation film 40 may function as an anti-reflection film that prevents reflection of light incident on the back surface of the solar battery 10.

The first electrode 42 may be electrically connected to the first conductive region 32 through the contact hole 46, and the second electrode 44 may be electrically connected to the second conductive region 34 through the contact hole 46.

In the present embodiment, the first electrode 42 may be formed in a stripe shape to correspond to the first conductive region 32 extending in the first direction, and the second electrode 44 may be formed in a stripe shape to correspond to the second conductive region 34 extending in the second direction. For example, the area of the first electrode 42 may be 25% to 75% of the area of the first conductive region 32, and the area of the second electrode 44 may be 25% to 75% of the area of the second conductive region 34. Within this range, the effect of carrier collection and transfer may be improved. However, the present disclosure is not limited thereto, and various modifications are possible.

The contact hole 46 may be formed to connect (e.g., contact) only a portion of the first and second electrodes 42 and 44 to the first conductive region 32 and the second conductive region 34, respectively. For example, a plurality of contact holes 46 may be formed to correspond to one first electrode 42 or one second electrode 44. As a result, it is possible to reduce the formation area of the contact hole 46 to simplify the process of forming the contact hole 46 and to prevent problems such as deterioration in properties that may occur when the contact hole 46 is formed. Alternatively, each of the contact holes 46 may be formed in the entire length of the first and second electrodes 42 and 44 to correspond to the first and second electrodes 42 and 44. Thus, it is possible to maximize the contact area between the first and second electrodes 42 and 44 and the first conductive region 32 and the second conductive region 34 to improve carrier collection efficiency. Various other modifications are possible.

In the present embodiment, the first electrode 42 and/or the second electrode 44 may include a metal 40a and an adhesive material 40b. In the enlarged circle of FIG. 4, the portion where the first electrode 42 is positioned is enlarged, and will be described below based on this, but the second electrode 44 may also have the same or extremely similar structure. Hereinafter, the first and/or second conductive regions 32 and 34 will be described by referring to as the conductive regions 32 and 34, and the first and/or second electrodes 42 connected thereto will be described by referring to as the electrodes 42 and 44.

In the present embodiment, the electrodes 42 and 44 connected to the conductive regions 32 and 34 (or the polycrystalline semiconductor layer 30 constituting the electrodes 42 and 44, hereinafter the same) may include a printed layer 420 formed by applying a paste containing the metal 40a and the adhesive material 40b through the printing process. As described above, since the electrode 420 is formed of the printed layer 420 formed using the paste, some solvents, additives, and the like may partially remain. However, the present disclosure is not limited thereto. It may be seen whether the electrodes 42 and 44 are formed of the printed layer 420 formed by using the paste by checking a shape of particles made of the metal 40a positioned in the electrodes 42 and 44 through a microscope, checking that the solvent, the adhesive material 40b, or the like remain through component analysis, or the like. The method for manufacturing electrodes 42 and 44 and the printed layer 420 constituting the electrodes 42 and 44 will be described later in more detail. For example, in the present embodiment, the electrodes 42 and 44 may be formed of a single printed layer 420 including the metal 40a and the adhesive material 40b.

In the present embodiment, the metal 40a may include a first metal that may chemically react with a semiconductor material constituting the conductive regions 32 and 34 to form a metal-semiconductor compound. In addition, the metal 40a may include a second metal having a lower resistivity than the first metal. The second metal having a relatively low resistivity corresponds to a main component metal included in a relatively large amount in order to lower the resistance of the electrodes 42 and 44. Here, the main component metal may mean a metal that is included in an amount of 50 parts by weight or more (for example, more than 50 parts by weight) based on total 100 parts by weight of the metal 40a.

For example, the first metal may include nickel (Ni). Then, the compound layer 50 containing a metal-semiconductor compound (e.g., nickel silicide such as NiSi, $Ni_2Si$, etc.) that chemically reacts easily with the semiconductor material (e.g., silicon) constituting the conductive regions 32 and 34 may be easily formed. When the compound layer 50 including nickel silicide is formed between the conductive regions 32 and 34 and the electrodes 42 and 44 at the boundary of the conductive regions 32 and 34 and the electrodes 42 and 44, it is possible to greatly reduce the contact resistance of the electrodes 42 and 44, and since the electrodes 42 and 44 and the conductive regions 32 and 34 have excellent adhesive properties, it is possible to effectively prevent the electrodes 42 and 44 from being separated. Thermal stability may be improved by low thermal stress. In addition, when the second metal includes copper, silver, alloys thereof, etc., the resistivity is low, and thus, it is possible to improve electrical characteristics of the electrodes 42 and 44. Copper has a low resistance and is inexpensive, and silver has a very low resistance, and thus, may exhibit excellent electrical characteristics.

Here, a part by weight of the first metal based on total 100 parts by weight of the metal 40a may be smaller than that of the second metal based on 100 parts by weight of the entire metal 40a. That is, the first metal may be included only in a small amount sufficient to form the compound layer 50, and the second metal may be included in a relatively large amount to effectively improve the resistance characteristics of the electrodes 42 and 44. For example, in the electrodes 42 and 44, the part by weight of the first metal based on total 100 parts by weight of the metal 40a is 15 or less (for example, 1 to 10), and the part by weight of the second metal based on 100 parts by weight of the entire metal 40a may be 85 or more (e.g., 85 to 99). When the part by weight of the first metal exceeds 15 or a part by weight of the second metal is less than 85, the resistance of the electrodes 42 and 44 may increase, and thus, the electrical characteristics may decrease. When the part by weight of the first metal is less than 1 or the part by weight of the second metal exceeds 99, the compound layer 50 is not sufficiently formed, so resistance, contact properties, etc., between the conductive regions 32 and 34 and the electrodes 42 and 44 may be deteriorated. For example, when the electrodes 42 and 44 are provided as a single printed layer 420, the part by weight of the first metal may be 10 or less to further lower the resistance of the electrodes 42 and 44. However, the present disclosure is not limited thereto, and the parts by weight of the first metal and the second metal may be changed.

In the present embodiment, it is exemplified that the metal 40a is provided in the form of the first particles 402 including the first metal and the second particles 404 including the second metal. In this case, the first particle 402 may be composed of nickel particles and the second particle 402 may be composed of copper particles, silver-coated copper particles, silver particles, or the like. Here, the first particle 402 or the second particle 404 may have various shapes, such as a spherical shape, a flake shape, and an irregular shape.

For example, the first particle 402 may include particles having a size smaller than the average size or minimum size of the second particle 404. Alternatively, an average size of the first particles 402 may be smaller than that of the second particles 404. Here, the particle size may mean a diameter when the particle has a spherical shape, and may mean a length of a major axis when the particle has a major axis and a minor axis. For example, the average size of the first particles 402 may be 50 nm to 5 µm, and the average size of the second particles 404 may be 100 nm to 10 µm. In this way, in the printing process for forming the electrodes 42 and 44, the small-sized first particles 402 may be more easily positioned adjacent to the conductive regions 32 and 34, and may be easily diffused in the heat treatment process for forming the electrodes 42 and 44 and may be easily chemically combined with the semiconductor material of the conductive regions 32 and 34. That is, in the present embodiment, the compound layer 50 may include the first particles 402 having a relatively small size in a relatively small amount so that the compound layer 50 may be partially formed in a first region A1 at the boundary between the electrodes 42 and 44 and the conductive regions 32 and 34.

However, the present disclosure is not limited thereto. Therefore, the first metal and the second metal may not be included as separate first particles 402 and second particles 404, respectively. For example, as illustrated in FIG. 6A, particles in which a coating layer 402a made of the first metal is formed on a surface of a core particle 404a made of the second metal may be used as the metal 40a. In this case, as illustrated in FIG. 6B, the second metal may remain in the form of the core particle 404a and the first metal may remain in a layered coating layer 402a positioned on a surface of at least a portion of the core particle 404a. For example, the metal 40a may include nickel-coated copper particles, nickel-coated silver particles, and the like. Accordingly, it is possible to implement the desired characteristics by using one type of particle without mixing a plurality of different particles, thereby simplifying the manufacturing process. In addition, the first metal and the second metal may be included in various forms.

The above-described embodiment illustrates that, since the electrodes 42 and 44 do not contain a solder material (e.g., tin (Sn)) as the metal 40a, it is possible to reduce material cost and prevent the deterioration in the resistance properties of the electrodes 42 and 44. However, the present disclosure is not limited thereto, and the electrodes 42 and 44 may partially include a solder material (e.g., tin or an alloy including tin) as the metal 40a. For example, the solder material may be included as part of the first metal and/or second metal, or the first particle 402 and/or the second particle 404, the core particle 404a and/or the coating layer 402a, or the solder material or the solder particles may be included as the first metal and the second metal, or the first particle 402 and the second particle 404, the core particle 404a coated with the coating layer 402a, and a separate additional metal. In this way, it is possible to improve the contact properties between the adhesive layer LSP and the electrodes 42 and 44 by including the same or similar solder material as or to the solder material included in the adhesive layer LSP and/or the wiring unit 140. In this way, when the solder material is included in the electrodes 42 and 44, a part by weight of the solder material may be smaller than the part by weight of the first metal and the part by weight of the second metal, respectively, so as not to deteriorate the resistance characteristics of the electrodes 42 and 44. However, the present disclosure is not limited thereto. Therefore, the part by weight of the solder material may be equal to or greater than any one of that of the first metal and that of the second metal so as not to deteriorate the resistance characteristics of the electrodes 42 and 44. Various other modifications are possible.

In the present embodiment, the electrodes 42 and 44 may include the adhesive material 40b to improve the adhesive properties with the conductive regions 32 and 34 or the polycrystalline semiconductor layer 30 and the adhesive layer LSP. Various known materials may be used as the adhesive material 40b. The adhesive material 40b is a material capable of improving the adhesive properties with the adhesive layer LSP or the wiring material 142, and may include an organic material such as an organic binder, a resin, or rosin, and may have non-conductive characteristics. Most of the adhesive material 40b may remain even after hardening heat treatment for forming the electrodes 42 and 44 or adhesive heat treatment for bonding the wiring material 140. Accordingly, the adhesive material 40b may be adjacent to (e.g., in contact with) the conductive regions 32 and 34 or the polycrystalline semiconductor layer 30, thereby stably maintaining the adhesive properties.

For example, when the total of the metal 40a and the adhesive material 40b is 100 parts by weight, the part by weight of the adhesive material 40b may be 5 to 15, and the part by weight of the metal 40a may be 85 to 95. When the part by weight of the adhesive material 40b is less than 5 or the part by weight of the metal 40a exceeds 95, the effect of improving the adhesive properties by the adhesive material 40b may not be sufficient. When the part by weight of the adhesive material 40b exceeds 15 or the part by weight of the metal 40a is less than 85, the amount of metal 40a may be relatively small and the electrical characteristics may be deteriorated. However, the present disclosure is not limited thereto, and the amounts of metal 40a, the adhesive material 40b, and the like may be variously changed.

As described above, the electrodes 42 and 44 may be formed of the printed layer 420. More specifically, the printed layer 420 may be made of a low-temperature electrode paste that is hardened by the hardening heat treatment performed at a temperature of 500° C., or lower. Therefore, even after the hardening heat treatment is performed, as the shapes of the first particles 402 and the second particles 404 are partially changed, firing or sintering that causes a necking phenomenon, in which the first particles 402 and the second particles 404 are connected, or the like does not occur. That is, as a solvent or the like is volatilized by hardening heat treatment, the first particles 402 and the second particles 404 (or the core particles 404a) constituting the metal 40a in the printed layer 420 or the electrodes 42 and 44 may be provided in the form of being electrically connected by contacting each other while being maintained in the particle state. In addition, the adhesive material 40b fills an empty space in which the first particles 402, the second particles 404 (or the core particles 404a), and the like constituting the metal 40a are not positioned, or may be positioned while covering the surfaces of the first particles 402, the second particle 404 (or the core particle 404a), and the like. The method for forming electrodes 42 and 44 will be described in more detail later in the solar battery 10 and the method for manufacturing a solar battery panel 100 including the same.

As described above, the electrodes 42 and 44 are formed of the printed layer 420 (for example, formed of the single printed layer 420), and the electrodes 42 and 44 may be formed to a sufficient thickness even in one-time printing process. For example, a thickness (e.g., maximum thickness) T1 (e.g., a thickness of the single printed layer 420) of the electrodes 42 and 44 may be 10 μm or more. For example, the thickness T1 (e.g., the thickness of a single printed layer 420) of the electrodes 42 and 44 may be 10 μm to 30 μm (e.g., 20 μm to 30 μm). When the thickness T1 is provided, the electrodes 42 and 44 have sufficient volume or cross-sectional area, so that the resistance of the electrodes 42 and 44 may be sufficiently lowered and the electrodes 42 and 44 may be stably formed. When the resistance is lowered in this way, the charging density may be improved, and thus the efficiency of the solar battery 10 may be improved.

In this case, the electrodes 42 and 44 may include a portion in which at least a portion thereof contacts the conductive regions 32 and 34, or a portion that contacts the compound layer 50 formed by bonding a semiconductor material included in the conductive regions 32 and 34 and a metal (i.e., the first metal) included in the electrodes 42 and 44.

For example, the compound layer 50 may be partially formed to correspond to the first region A1 at the boundary between the electrodes 42 and 44 and the conductive regions 32 and 34. That is, in a plan view, the compound layer 50 may be formed only in the first region A1 in the portion (that is, the boundary at which the conductive regions 32 and 34 and the electrodes 42 and 44 overlaps in the contact hole 46) where the electrodes 42 and 44 are positioned within the contact hole 46. Here, the compound layer 50 may be made of the metal-semiconductor compound (e.g., nickel silicide) formed by chemically reacting and bonding the first metal (e.g., nickel) included in the electrodes 42 and 44 and the semiconductor material (e.g., silicon) included in the conductive regions 32 and 34.

In the present embodiment, the compound layer 50 is formed by being chemically combined with the semiconductor material while the first metal contained in the printed layer 420 is diffused during the hardening heat treatment process of the printed layer 420 constituting the electrodes 42 and 44, so the compound layer 50 is not formed entirely at the boundary between the conductive regions 32 and 34 and the electrodes 42 and 44 but is discontinuously formed or partially formed, and the thickness thereof may also be non-uniform. For example, the plurality of compound layers 50 spaced apart from each other may be provided under the electrodes 42 and 44 in one contact hole 46, or the plurality of compound layers 50 having different thicknesses may be provided under the electrodes 42 and 44. Here, the non-uniform thickness or the different thicknesses may mean that a portion having a thickness difference of 5% or more exists.

Here, the first metal constituting the compound layer 50 is included in a relatively small amount, and the compound layer 50 is formed by the first metal positioned at the boundary between the conductive regions 32 and 34 and the electrodes 42 and 44, so the compound layer 50 may be partially formed in a narrow area and may be evenly distributed over the entire area of the electrodes 42 and 44. For example, at the boundary between the conductive regions 32 and 34 and the electrodes 42 and 44, the plurality of compound layers 50 are positioned and a plurality of first virtual lines IL1 parallel to a first direction may be provided, and the plurality of compound layers 50 may be positioned and a plurality of second virtual lines IL2 parallel to a second direction may be provided. For example, a ratio of a total area of the first region A1 to a total area of the boundary between the conductive regions 32 and 34 and the electrodes 42 and 44 may be 50% or less. More specifically, the total area of the first area A1 may be smaller than the total area of the second area A2. Alternatively, the area of the at least one compound layer 50 (e.g., the area of each compound layer 50) may be the same as or smaller than the size of the second particle 404 (or the core particle 404*a*). However, the present disclosure is not limited thereto, and the area of each compound layer 50 may be larger than the size of the second particle 404 (or the core particle 404*a*).

In particular, in the present embodiment, since the conductive regions 32 and 34 are formed of the polycrystalline semiconductor layer 30, the compound layer 50 having a narrow area and uniformly distributed may be stably formed. Since the polycrystalline semiconductor layer 30 is chemically unstable compared to a single crystal semiconductor substrate and has a grain boundary or the like, diffusion of the first metal, reaction with a semiconductor material, etc., may easily occur, so the compound layer 50 may be easily formed locally in the portion where the first metal is located. Accordingly, the electrodes 42 and 44 including the first metal are formed on the polycrystalline semiconductor layer 30 to evenly form each compound layer 50 in a narrow area, so the resistance characteristics, the contact properties, and the like of the electrodes 42 and 44 and the conductive regions 32 and 34 may be effectively formed.

In addition, in the second area A2 except for the first area A1 at the boundary between the electrodes 42 and 44 and the conductive regions 32 and 34, the metal 40*a* and the adhesive material 40*b* are formed in contact with the polycrystalline semiconductor layer 30. In the present embodiment, the core particle 404*a* and/or the adhesive material in which the first metal or first particle 402, the second metal or second particle 404, or the coating layer 402*a* is formed in the second area A2 40*b* may be formed in contact with the polycrystalline semiconductor layer 30. In this way, in the second region A2 where the compound layer 50 is not provided, the metal 40*a* is in contact with the conductive regions 32 and 34 to improve the electrical characteristics. In addition, the adhesive material 40*b* is in contact with the conductive regions 32 and 34 or the polycrystalline semiconductor layer 30 to improve the adhesive properties of the electrodes 42 and 44, thereby preventing the problems such as the peeling of the electrodes 42 and 44 and improving the mechanical reliability. As described above, since the second region A2 has a larger area than the first region A1, the electrodes 42 and 44 may have excellent electrical characteristics and adhesive properties.

When light is incident on the solar battery 10 according to the present embodiment, electrons and holes are generated by photoelectric conversion in a pn junction formed between the base region 12*a* and the first conductive region 32, and the generated holes and electrons pass through the intermediate layer 20, move to the first conductive region 32 and the second conductive region 34, respectively, and then, move to the first and second electrodes 42 and 44. As a result, electrical energy is generated.

The wiring unit 140 is electrically connected on the solar battery 10. More specifically, the electrodes 42 and 44 and the wiring material 142 may be electrically connected or insulated by the overlapping portion LSP and the insulating member IP.

More specifically, in the present embodiment, the wiring material 142 includes a plurality of first and second wirings 142a and 142b extending in a second direction in which the first and second electrodes 42 and 44 intersect each other. More specifically, the first wiring 142a may extend in the second direction to be electrically connected to the first electrode 42, and the second wiring 142b may extend in the second direction to be electrically connected to the second electrode 44. A plurality of first wirings 142a and a plurality of second wirings 142b may be provided, and the first wirings 142a and the second wirings 142b may be alternately positioned to each other in the first direction. Then, the plurality of first and second wirings 142a and 142b may be connected to the first and second electrodes 42 and 44 while having uniform spacing to effectively transfer carriers.

In this case, the adhesive layer LSP may be positioned in the overlapping portion to be electrically connected to each other among the plurality of overlapping portions of the wiring material 142 and the electrodes 42 and 44, and the insulating member IP may be positioned in the overlapping portion not to be electrically connected to each other. That is, the first wiring 142a may be positioned on the first electrode 42 with the adhesive layer LSP interposed therebetween to be electrically connected to the first electrode 42, and the second wiring 142b may be connected to the provided second electrode 44 with the adhesive layer LSP interposed therebetween to be electrically connected to the second electrode 44. The insulating member IP may be positioned between the wiring material 142 and the electrodes 42 and 44 at the overlapping portion of the first wiring 142a and the second electrode 44 and the overlapping portion of the second wiring 142b and the first electrode 42 to electrically insulate the wiring material 142 and the electrodes 42 and 44.

The insulating member IP may include various insulating materials. For example, the insulating member IP may include a silicone-based resin, an epoxy-based resin, a urethane-based resin, an acrylic-based resin, polyimide, polyethylene, or the like.

In the present embodiment, the adhesive layer LSP may be positioned between the first electrode 42 and the first wiring 142a to be in contact with the first electrode 42 (or the printed layer 420 constituting the first electrode 42) and the first wiring 142a, respectively. Similarly, the adhesive layer LSP may be positioned between the second electrode 44 and the second wiring 142b to be in contact with the second electrode 44 (or the printed layer 420 constituting the second electrode 44) and the second wiring 142b, respectively. The adhesive layer LSP may serve to temporarily fix the first or second electrodes 42 and 44 and the wiring material 142, and serve to attach the first or second electrodes 42 and 44 and the wiring material 142 by being melted and then hardened in the adhesive heat treatment process (e.g., lamination process) for adhering the wiring material 142. More specifically, in the adhesive heat treatment process, the adhesive layer LSP made of the low-temperature solder paste may be melted to electrically and physically connect the electrodes 42 and 44 and the wiring material 142. As described above, long-term reliability may be improved by the adhesive layer LSP composed of the low-temperature solder paste. On the other hand, when the adhesive layer LSP is not present, the sealing material 130 may penetrate between the electrodes 42 and 44 and the wiring material 142 during the lamination process, thereby causing bonding defects.

In the present embodiment, the adhesive layer LSP may be made of the low-temperature solder member formed using the low-temperature solder paste containing a solder material. Here, the low-temperature solder paste or the low-temperature solder member may include a solder material having a relatively low melting point including bismuth. For example, the low-temperature solder paste or the low-temperature solder member constituting the adhesive layer LSP may have a melting point of 150 to 200° C. (e.g., a melting point of 90 to 130° C.). Alternatively, the low-temperature solder paste or the low-temperature solder member constituting the adhesive layer LSP may have a melting point lower than the process temperature of the lamination process. In addition, the adhesive layer LSP may further include an additional adhesive material in addition to the solder material.

For example, the solder material may include tin and bismuth, and may further include copper. Tin is a basic material included for soldering, and bismuth is a material included to lower the melting point of the adhesive layer LSP. Here, bismuth may be included in an amount of 10 parts by weight or more (e.g., 30 parts by weight or more, for example, 50 parts by weight or more) based on total 100 parts by weight of the metal included in the adhesive layer LSP. Since bismuth is expensive, the bismuth is generally not included in many parts by weight as described above as usages other than the usage for lowering the melting point. Therefore, the adhesive layer LSP including the bismuth in an amount of 10 parts by weight or more may be determined as the low-temperature solder paste or the low-temperature solder member. Copper may be included to improve electrical conductivity of the adhesive layer LSP, and may be included in an amount smaller than each of tin and bismuth. As described above, the adhesive layer LSP contains copper to improve electrical conductivity, so the adhesive layer LSP may sufficiently perform a role as a portion of the electrode in the broad sense of transferring the carrier of the solar battery 10 together with the electrodes 42 and 44. That is, the adhesive layer LSP may be a solder paste electrode that serves both as a solder paste for adhesion to the wiring material 142 and as an electrode in a broad sense for improving electrical characteristics.

In addition, various materials may be used as an additional adhesive material used in the adhesive layer LSP. For example, the additional adhesive material used in the adhesive layer LSP may include an organic material such as an organic binder, a resin, or rosin. The low-temperature solder paste before being hardened may contain an additional adhesive material in a relatively large amount (for example, 40 to 55 parts by weight based on 100 parts by weight). After the adhesive heat treatment process, most of the additional adhesive material of the adhesive layer LSP is volatilized, removed, or leaked outside and may not remain in a large amount. That is, the additional adhesive material of the adhesive layer LSP may be included in a large amount before the adhesive heat treatment process for adhering the wiring material 140, so the excellent adhesive properties are realized before the adhesive heat treatment process or during the adhesive heat treatment process, and most of the additional adhesive material may be removed after the heat treatment process for attaching the wiring material 140 so that the adhesive layer LSP has excellent electrical conductivity.

As described above, most of the adhesive material 40b included in the electrodes 42 and 44 remains even after the hardening heat treatment or the adhesive heat treatment, and most of the additional adhesive material of the adhesive layer LSP may be removed after the adhesive heat treatment process. This may be implemented by adjusting types, compositions, characteristics, and the like of the adhesive material 40b included in the electrodes 42 and 44 and the additional adhesive material included in the adhesive layer LSP. For example, the adhesive material 40b included in the electrodes 42 and 44 may be made of organic material that may be more easily volatilized (e.g., higher in volatility) in heat treatment at room temperature or higher than the additional adhesive material included in the adhesive layer LSP. However, the present disclosure is not limited thereto, and may be implemented by adjusting various properties of the adhesive material 40b included in the electrodes 42 and 44 and the additional adhesive material included in the adhesive layer LSP. For example, before the adhesive heat treatment process, the part by weight of the adhesive material 40b based on total 100 parts by weight of the electrodes 42 and 44 is smaller than the part by weight of the additional adhesive material based on total 100 parts by weight of the adhesive layer LSP. When the amount of the adhesive material 40b of the electrodes 42 and 44 increases, wettability between the electrodes 42 and 44 and the adhesive layer LSP may be inhibited, so the amount of the adhesive material 40b of the electrodes 42 and 44 relatively decreases. On the other hand, after the adhesive heat treatment process, the part by weight of the adhesive material 40b based on total 100 parts by weight of the electrodes 42 and 44 is greater than the part by weight of the additional adhesive material based on total 100 parts by weight of the adhesive layer LSP. By allowing a relatively large amount of the adhesive material 40b to remain, the adhesive properties of the electrodes 42 and 44 may be improved, and most of the additional adhesive material in the adhesive layer LSP may be removed, so the electrical conductivity of the adhesive layer LSP may be improved. However, the present disclosure is not limited thereto, and after the adhesive heat treatment process, the part by weight of the adhesive material 40b based on total 100 parts by weight of the electrodes 42 and 44 may be equal to or smaller than the part by weight of the additional adhesive material based on total 100 parts by weight of the adhesive layer LSP.

In the present embodiment, the electrodes 42 and 44 formed using the electrode paste including the adhesive material 40b and the adhesive layer LSP formed using the low-temperature solder paste including the additional adhesive material may have excellent adhesive properties. This is because the electrode paste and the low-temperature solder paste each have the metal, the adhesive material 40b, and the additional adhesive material to have similar characteristics. This is because the adhesive material 40b included in the electrodes 42 and 44 and the additional adhesive material included in the adhesive layer LSP react with each other to improve the adhesive properties. For example, since the adhesive material 40b included in the electrodes 42 and 44 and the additional adhesive material included in the adhesive layer LSP have the same or similar polarity or characteristics, the adhesive properties of the adhesive material 40b and the additional adhesive material of the adhesive layer LSP may be improved. Alternatively, the amount of the adhesive material 40b included in the electrodes 42 and 44 and the additional adhesive material included in the adhesive layer LSP is adjusted to minimize the polarity difference or the characteristic difference between the electrode paste and the low-temperature solder paste, so adhesive properties of the adhesive material 40b and the adhesive layer LSP may be improved.

In the present embodiment, the electrodes 42 and 44 are formed of the single printed layer 420 and may have a shape protruding convexly toward the wiring material 142 or a shape including a rounded portion (a round shape as a whole). In this case, the surface roughness of the electrodes 42 and 44 may be greater than that of the adhesive layer LSP (e.g., the surface roughness of the side surface LS of the adhesive layer LSP). The electrodes 42 and 44 may be formed by applying the electrode paste and performing the hardening heat treatment to have the relatively large surface roughness, and the adhesive layer LSP may have excellent wettability with the wiring material 142 and have the relatively small surface roughness while being compressed under pressure during the adhesive heat treatment process. Since the adhesive layer LSP is positioned on the electrodes 42 and 44 that are convexly protruded or formed to be round and have the relatively large surface roughness, the contact area between the electrodes 42 and 44 and the adhesive layer LSP may be maximized. Accordingly, the adhesive properties of the electrodes 42 and 44 and the adhesive layer LSP may be further improved.

As described above, since the adhesive layer LSP formed of the electrodes 42 and 44 (e.g., a single printed layer 420) having the metal 40a and the adhesive material 40b and the low-temperature solder paste has excellent adhesive properties, the electrodes 42 and 44 and the adhesive layer LSP may be positioned in contact with each other without a separate connecting member (e.g., a conventional high-temperature solder paste layer). Accordingly, the electrodes 42 and 44 and the adhesive layer LSP may be directly connected to each other to have excellent adhesive properties while having a simple structure. That is, the present embodiment has a difference from the conventional solar battery in that the electrodes 42 and 44 are formed by being in direct contact with the adhesive layer LSP having an increasing width while facing the wiring material 142, the adhesive layer LSP containing bismuth, or the adhesive layer LSP made of the low-temperature solder paste having a melting point below a certain level. As described above, the removal of this high-temperature solder paste layer may reduce costs and simplify the process. In addition, the high-temperature solder paste layer has a large thickness of about 50 to 60 μm, and by removing the high-temperature solder paste layer, it is possible to improve the attachment stability of the wiring material 142.

On the other hand, in the related art, the high-temperature solder paste layer is provided between a sputtering electrode layer formed by sputtering and the adhesive layer made of the low-temperature solder paste. The high-temperature solder paste layer may have a melting point of 280° C., or higher or soldered by heat treatment at a temperature of 280° C., or higher. Since the sputtering electrode does not include the adhesive material or the organic material, the wettability with the low-temperature solder paste is very low and the sputtering electrode has a smaller surface roughness than the adhesive layer made of the low-temperature solder paste while having a flat surface. Accordingly, the adhesive properties with the low-temperature solder paste are not excellent, so the high-temperature solder paste layer should be additionally provided. For reference, since the high-temperature solder paste layer does not contain bismuth or is included in a small amount, the high-temperature solder paste layer and the low-temperature solder paste (or adhesive layer LSP) may be easily distinguished by checking the amount of bismuth by component analysis.

In the present embodiment, it is possible to have excellent electrical characteristics by providing the electrodes 42 and 44 and the adhesive layer LSP having sufficient thickness. For example, the thickness T1 of the electrodes 42 and 44 may be 10 μm to 30 μm (e.g., 20 μm to 30 μm) as described above, and the thickness T2 (e.g., minimum thickness) of the adhesive layer LSP may be 10 μm or more (more specifically, 10 μm to 50 μm). For example, the thickness T2 of the adhesive layer LSP may be 30 μm or less, and the thickness 12 of the adhesive layer LSP may be 20 μm or more. Alternatively, a ratio T1/T2 of the thicknesses T1 of the electrodes 42 and 44 to the thicknesses T2 of the adhesive layer LSP may be 0.5 or more. More specifically, the ratio T1/T2 of the thicknesses T1 of the electrodes 42 and 44 to the thicknesses T2 of the adhesive layer LSP may be 5 or less, for example, 2 or less. As described above, the ratio T1/T2 of the thickness T1 of the electrodes 42 and 44 to the thickness T2 of the adhesive layer LSP is large, so the electrodes 42 and 44 are formed of the single printed layer 420 without including a separate electrode layer, and thus, may have excellent electrical characteristics. However, the present disclosure is not limited thereto, and various modifications are possible.

In the present embodiment, the electrodes 42 and 44 are formed to be spaced apart from the back surface passivation film 40 inside the contact hole 46, and the adhesive layer LSP may further include a margin portion MP that is positioned outside the electrodes 42 and 44 inside the contact hole 46 of the electrodes 42 and 44 to be in contact with the conductive regions 32 and 34. As described above, when the electrodes 42 and 44 are positioned only inside the contact hole 46, the area where the electrodes 42 and 44 are formed on the back surface of the solar battery 10 having the back surface electrode structure may be minimized. Accordingly, it is possible to reduce material costs, prevent the warpage phenomenon of the solar battery 10, and effectively induce optical path control (e.g., internal reflection) by the back surface passivation film 40. In addition, alignment characteristics may be improved by the margin portion MP, and the entire surface of the electrodes 42 and 44 may be entirely covered. As an example, the margin portion MP may be provided at a thickness of 20 μm or less from the outer side of the electrodes 42 and 44 based on one side. As a result, it is possible to reduce the material cost of the adhesive layer LSP or the like. However, the present disclosure is not limited thereto, and the width of the margin portion MP or the like may be variously modified.

On the other hand, the sputtering electrode formed of a metal film formed by the conventional sputtering partially remains on the back surface passivation film as well as the inside of the contact hole for alignment for patterning (i.e., to prevent misalignment). As a result, there is a limit in reducing the area of the electrode, so the material cost is high, the warpage phenomenon of the solar battery may occur, and it is difficult to effectively induce internal reflection. Accordingly, there is a difficulty in improving the efficiency of the solar battery.

In addition, the adhesive layer LSP including the solder material has excellent wettability with the wiring material 142 including the solder material. For example, the adhesive layer LSP may be formed in contact with the electrodes 42 and 44 and the wiring material 142, respectively, between the electrodes 42 and 44 and the wiring material 142. In this case, the width of the adhesive layer LSP may have a width gradually increasing toward the wiring material 142, and the lateral surface LS of the adhesive layer LSP may have a concave shape toward the wiring material 142. Accordingly, the adhesive layer LSP may have a concave side shape as the width gradually increases toward the wiring material 142 while covering the entire surface of the electrodes 42 and 44 which are convexly protruding or formed to be rounded. For example, a ratio W2/W1 of a second width W2 of the adhesive layer LSP adjacent to the wiring material 142 to a first width W1 of the adhesive layer LSP adjacent to the conductive regions 32 and 34 may be 1.2 to 3. Accordingly, the adhesive properties may be improved by increasing the adhesive area between the adhesive layer LSP and the wiring material 142. However, the present disclosure is not limited thereto, and the first width W1, the second width W2, and their ratio W2/W1 may be variously modified.

In the present embodiment, the electrodes 42 and 44 that are formed of the printed layer 420 using the low-temperature electrode paste including the metal 40a including the first metal and the second metal and the adhesive material 40b are formed in the conductive regions 32 and 34 formed of the polycrystalline semiconductor layer 30. In particular, in the present embodiment, the electrodes 42 and 44 may have the excellent resistance and adhesive properties due to the excellent resistance and contact properties by the compound layer 50 by the first metal, the low resistance by the second metal, the excellent adhesive properties by the adhesive material 40b, and the sufficient thickness of the electrodes 42 and 44 while using the low-temperature electrode paste. By applying the electrodes 42 and 44 using the low-temperature electrode paste to the polycrystalline semiconductor layer 30 having excellent carrier mobility, the excellent electrical characteristics may be realized.

For example, in the present embodiment, the electrodes 42 and 44 may be formed of the single printed layer 420 without other electrode layers (e.g., a seed layer, a sputtering layer, a plating layer, etc.). Then, by simplifying the process of forming the electrodes 42 and 44 having excellent characteristics, the number of processes may be reduced and the defect rate may be improved, thereby improving productivity. In particular, the existing printing equipment may be used as it is, thereby preventing the burden on the equipment. For example, since it is not necessary to use expensive vacuum equipment such as sputtering or deposition to form the electrodes 42 and 44, the equipment costs may be reduced, and ion bombardment by deposition may be removed to minimize the damage to the conductive regions 32 and 34. In addition, since it is not necessary to perform the conventional processes such as sputtering, etching, and fire-through that may damage the solar battery or deteriorate the characteristics of the solar battery, the stability of the manufacturing process may be improved. As a result, the deterioration and damage in the characteristics of the solar battery 10 may be minimized, so the efficiency and reliability of the solar battery 10 may be improved, and the low cost or the existing equipment may be used, so the manufacturing process may be simplified and the productivity may be improved. It is possible to prevent problems caused by the deterioration in contact properties and the poor plating, which may occur when being formed by the plating.

In the high-temperature process (the process exceeding 500° C.), the metal 40a or the like included in the electrodes 42 and 44, etc., may be undesirably diffused to the inside of the semiconductor substrate 12 beyond the polycrystalline semiconductor layer 30 and may act as an impurity to greatly reduce an open circuit voltage. In the present embodiment, the electrodes 42 and 44 using the low-temperature electrode paste may be formed on the polycrystalline semiconductor layer 30 to effectively prevent the problem. In addition, the damage due to heat that may occur in the high-temperature process may also be prevented. Accordingly, it is possible to improve reliability while implementing excellent electrical characteristics. In addition, by using the polycrystalline semiconductor layer 30 as the conductive regions 32 and 34, the deterioration in properties due to the doped region formed in the semiconductor substrate 12 may be prevented, and when the contact hole 46 is formed, the semiconductor substrate 12 is not damaged, so the deterioration in the characteristics of the solar battery 10 may be prevented.

On the other hand, as an example of the related art, since the low-temperature paste used to prevent the deterioration in the properties of the amorphous semiconductor layer does not include the first metal in an appropriate amount, the formation of the compound layer, the resistance characteristics, etc., as described above are not considered at all, so the electrical conductivity is low and the adhesive properties are also poor. In particular, the low-temperature paste or the like used to prevent the deterioration in properties of the amorphous semiconductor layer may have problems such as peeling due to the poor adhesive properties with the polycrystalline semiconductor layer, and thus, is hard to be directly used in the polycrystalline semiconductor layer. In addition, when the electrode using the low-temperature paste is formed on the amorphous semiconductor layer, the electrical conductivity is low, so a transparent conductive layer, a plating layer, or the like formed of a transparent conductive oxide layer should be separately formed. Accordingly, there are problems such as increased material cost and complicated manufacturing process.

As another conventional example, in the solar battery having the polycrystalline semiconductor layer as the conductive region, after the sputtering electrode formed of the metal film is formed by the sputtering process, the protective film (resist) is formed by the printing process, and a portion of the metal film is removed by the wet etching process, so the electrode is formed. Accordingly, the damage to the solar battery may occur due to the sputtering process, the etching process, or the like. In addition, since the process of several steps should be performed, the process is complicated and the probability of occurrence of defects in each process increases.

Although the present embodiment illustrates that the adhesive layer LSP is formed to correspond to the overlapping portion, the adhesive layer LSP may also be formed on the plurality of insulating member IPs and the plurality of electrodes 42 and 44 along the direction in which each wiring material 142 extends corresponding to the wiring material 142 for bonding or temporarily fixing with the wiring material 142.

The solar battery 10 having the above-described structure and a method for manufacturing a solar battery panel 100 including the same will be described in detail with reference to FIGS. 1 to 6 and FIGS. 7A to 7G. FIGS. 7A to 7G are cross-sectional views illustrating the solar battery 10 and the method for manufacturing a solar battery panel 100 including the same according to the embodiment of the present disclosure. In the above description, detailed descriptions of the parts already described will be omitted, and the parts that have not been described will be mainly described in detail.

Figure 7A:
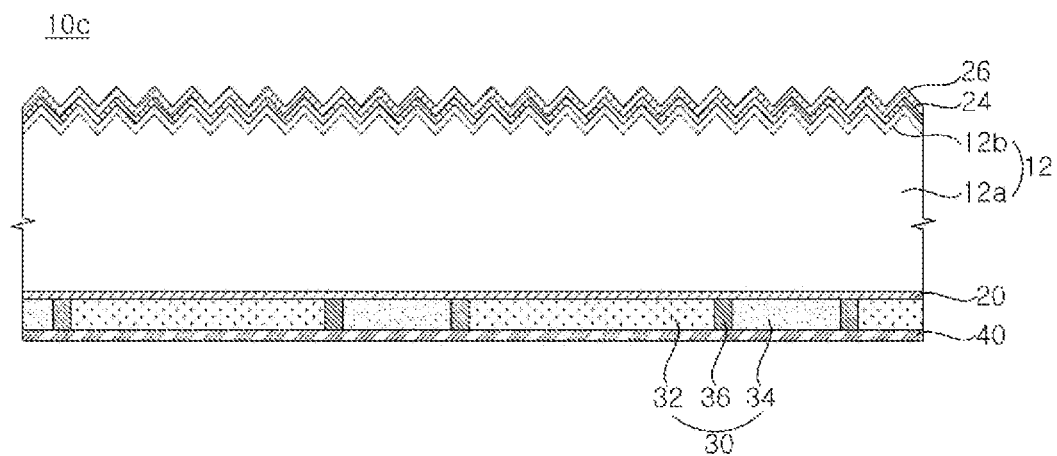
FIGS. 7A to 7G are cross-sectional views illustrating a solar battery and a method for manufacturing a solar battery panel including the same according to an embodiment of the present disclosure.

Referring to FIG. 7A, the intermediate layer 20, the first conductive region 32, the second conductive region 34, the barrier region 36 (polycrystalline semiconductor layer 30), the back surface passivation film 40, and the like are formed on the back surface of the semiconductor substrate 12, and a front electric field region 12b, a front passivation film 24, an anti-reflection film 26, and the like are formed on the front surface of the semiconductor substrate 12 to form a photoelectric converter 10c. The formation order, the formation method, and the like of the intermediate layer 20, the first conductive region 32, the second conductive region 34, the barrier region 36, the back surface passivation film 40, the front electric field region 12b, the front passivation film 24, the anti-reflection film 26, and the like may be variously modified.

For example, various processes known for texturing the semiconductor substrate 12 may be used. The intermediate layer 20 may be formed by a thermal growth method, a deposition method (e.g., chemical vapor deposition (PECVD), atomic layer deposition (ALD)), or the like. The first and second conductive regions 32 and 34 may be formed by doping a dopant into the polycrystalline semiconductor layer 30 formed by the thermal growth method, the deposition method (e.g., low-pressure chemical vapor deposition (LPCVD)), or the like. The doping of the dopant may be performed together in the process of forming the polycrystalline semiconductor layer 30, or may be performed by the doping process performed after forming the polycrystalline semiconductor layer 30. The front electric field region 12b may be formed by various doping processes. As the doping process performed after forming the polycrystalline semiconductor layer 30 or the doping process of forming the front electric field region 12b, various processes such as a laser doping process, a thermal diffusion process, and anion implantation process may be used. The front passivation film 24, the anti-reflection film 26, or the back surface passivation film 40 may be formed by various methods such as chemical vapor deposition, vacuum deposition, spin coating, screen printing, spray coating, and sputtering. However, the present disclosure is not limited thereto, and the formation method, the formation process, the formation order, and the like of the first and second conductive regions 32 and 34, the front passivation film 24, the anti-reflection film 26, or the back surface passivation film 40 may be variously modified.

Figure 7B:
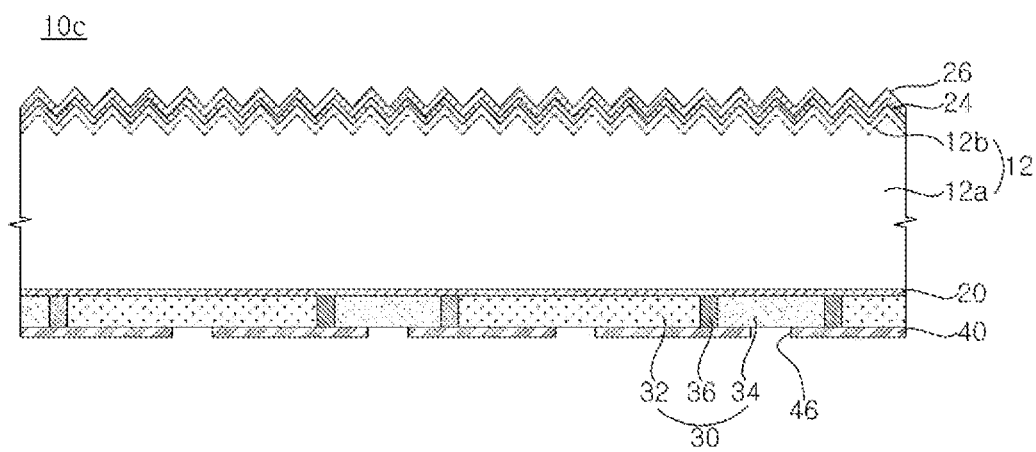

Subsequently, as illustrated in FIG. 7B, the contact hole 46 may be formed to correspond to a portion where the electrode (reference numerals 42 and 44 in FIG. 7C, hereinafter the same) is formed in the beck surface passivation film 40.

After forming the passivation film 40 as a whole, the contact hole 46 may be formed by performing various processes, such as a wet etching process using an etching paste, a mask or a mask layer, or the like and a laser etching process. An acid-based material may be used as the etching paste or the etching solution. Such a process may be performed at a low temperature, so the manufacturing process of the solar battery 10 may be implemented as a low temperature process. For example, in the present embodiment, the process of forming the contact hole 46 may be performed by the laser etching process. Since the polycrystalline semiconductor layer 30 constituting the conductive regions 32 and 34 is not greatly damaged by the laser etching process, the contact hole 46 may be formed by a simple process without the deterioration in the properties of the photoelectric converter. As a laser used in the laser etching process, lasers having various wavelengths (e.g., 532 nm, 1064 nm, etc.) may be used, and lasers having various pulses (short pulse, nano pulse, pico pulse, etc.) may be used. A burr may be formed in the back surface passivation film 40 around the contact hole 46 by the laser etching process, when viewed in cross section, a protruding portion may be formed in the back surface passivation film 40 around the contact hole 46, or a portion having different crystallinity may exist in the conductive regions 32 and 34 or the polycrystalline semiconductor layer 30 corresponding to the contact hole 46. However, the present disclosure is not limited thereto, and the characteristics, the shapes, and the like of the laser wavelength, the laser shape, the back surface passivation film 40, the conductive regions 32 and 34, and the polycrystalline semiconductor layer 30 may be variously modified.

Figure 7C:
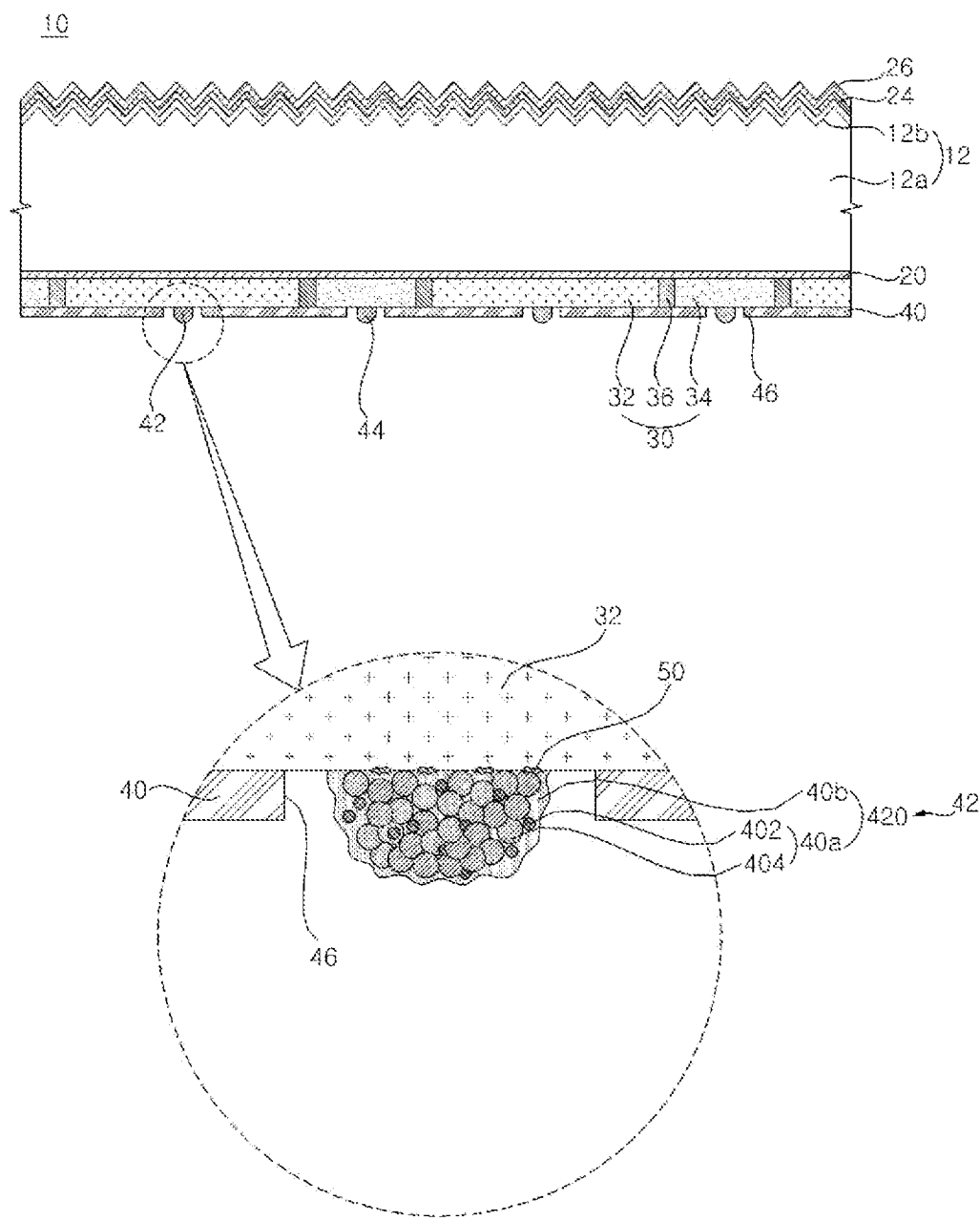

Then, as illustrated in FIG. 7C, the electrodes 42 and 44 connected to the conductive regions 32 and 34 are formed. In this case, the compound layer 50 made of the metal-semiconductor compound is formed together between the conductive regions 32 and 34 and the electrodes 42 and 44.

More specifically, the printed layer 420 in contact with the first and second conductive regions 32 and 34 may be formed by applying the low-temperature electrode paste including the metal 40a and the adhesive material 40b through the printing process, and is subjected to the drying and/or hardening heat treatment to form the electrodes 42 and 44. In addition, the low-temperature electrode paste may further include a solvent and other additives (e.g., a curing agent, a dispersing agent, etc.). In the present embodiment, after the contact hole 46 is formed, the low-temperature electrode paste is positioned in the contact hole 46, and the electrodes 42 and 44 are formed by the hardening heat treatment, so fire-through passing through the back surface passivation film 40 is not required in the heat treatment process. Accordingly, the low-temperature electrode paste does not include a glass frit made of a metal compound or the like.

Figure 6:
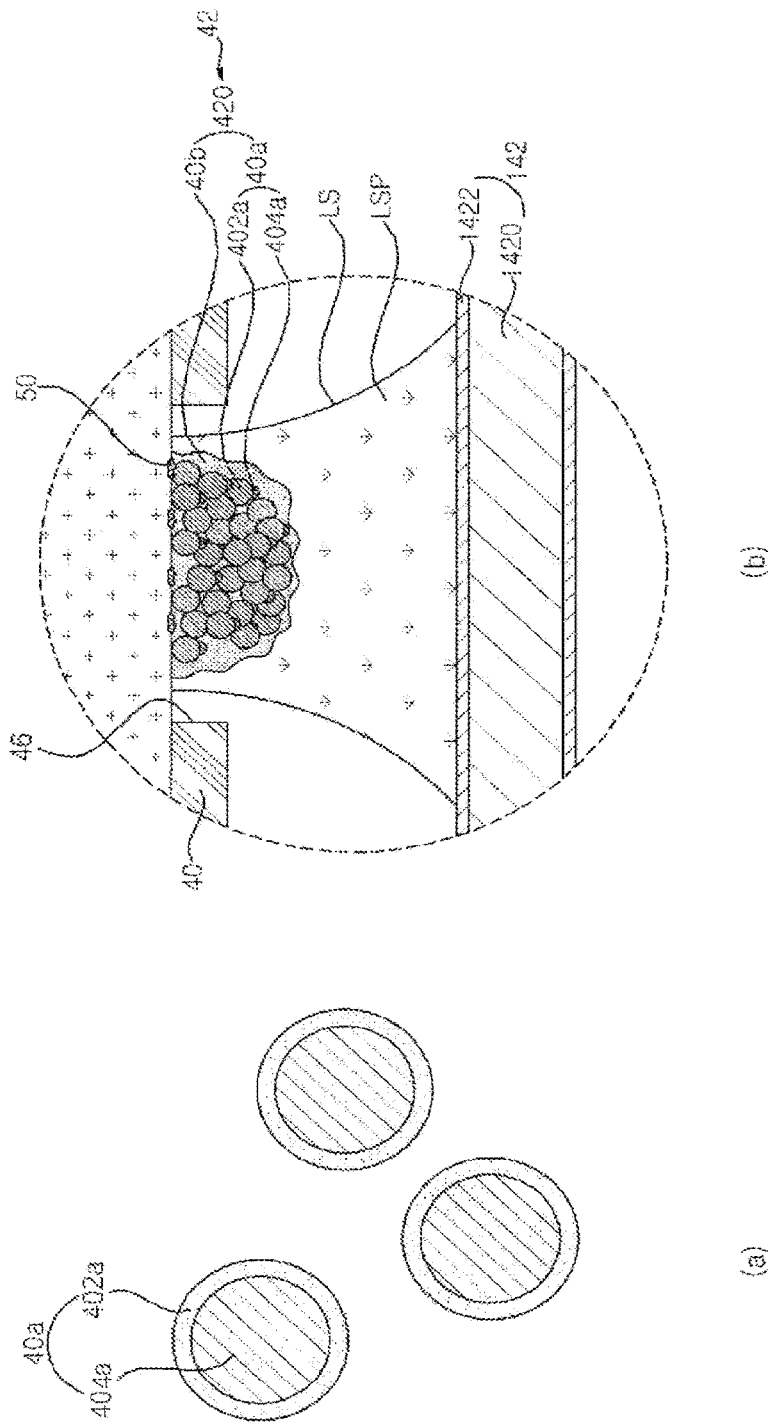
FIG. 6 is a conceptual diagram illustrating metal particles used to form an electrode of a solar battery included in a solar battery panel according to a modification of the present disclosure, and an enlarged cross-sectional view illustrating an electrode formed using the metal particles.

Here, the metal 40a may include a first metal and may further include a second metal. In this case, the first metal and the second metal may be included in the form of first particles 402 and second particles 404 each having a particle shape as illustrated in FIG. 4, and as illustrated in FIG. 6, may be included in the form in which the coating layer 402a including the second metal is formed on the core particle 404a made of the second metal. The first metal, the second metal, the first particle 402, the second particle 404, the core particle 404a, the coating layer 402a, the adhesive material 40b, etc., have been described in detail in the above description, and therefore, a description thereof will be omitted.

An organic solvent may be used as the solvent. For example, butyl carbitol acetate (BCA), cellulose acetate (CA), or the like may be used. However, the present disclosure is not limited thereto, and may include various other materials. The electrode paste for forming the electrodes 42 and 44 includes a solvent, but the solvent is volatilized during the sintering process, so the electrodes 42 and 44 may not include a solvent or may be included in a very small amount. Various materials also known as additives and the like may be used.

The above-described low-temperature electrode paste may be applied on the conductive regions 32 and 34 through the printing process. As an example, the low-temperature electrode paste is applied to be positioned on the conductive regions 32 and 34 inside the contact hole 46 (e.g., to be in contact with the conductive regions 32 and 34), so the electrodes 42 and 44 may be positioned only inside the contact hole 46.

The applied low-temperature electrode paste may be dried at a first temperature. The first temperature is higher than room temperature and may be 150° C., or lower. However, the present disclosure is not limited thereto, and the first temperature may have a different value. By drying the low-temperature electrode paste, it is possible to prevent problems such as unwanted dripping of the low-temperature electrode paste. When the heat treatment is performed immediately without including the drying step, the problems such as cracking may occur due to the temperature difference. Accordingly, after reducing fluidity by drying the low-temperature electrode paste at the first temperature lower than the heat treatment temperature, the hardening heat treatment is performed. However, the present disclosure is not limited thereto, and the drying process may be omitted.

The hardening heat treatment may be performed on the dried low-temperature electrode paste at a second temperature higher than the first temperature and lower than the higher melting point among the melting points of the first and second metals. In this case, the second temperature may be higher than the lower melting point among the melting points of the first and second metals. For example, the second temperature may be 500° C., or lower (e.g., 200 to 500° C. for example, 250 to 400° C.). However, the present disclosure is not limited thereto, and the second temperature may have a different value.

When the heat treatment is performed on the dried low-temperature electrode paste, the solvent is volatilized and heat is applied to the first and second metals. Then, in the hardening heat treatment process, the first electrode included in the first particles 402 or the coating layer 402a reacts with the semiconductor material of the conductive regions 32 and 34 to form the compound layer 50 made of the metal-semiconductor compound. The electrodes 42 and 44 may be formed using a low-temperature electrode paste including the first metal on the polycrystalline semiconductor layer 30 to form the plurality of compound layers 50 uniformly formed throughout while having a narrow area. For example, the first metal may include nickel, the semiconductor material may include silicon, and the compound layer 50 may include nickel silicide. The compound layer 50 has been described in detail in the above description, and therefore, a description thereof will be omitted.

In addition, the second particles 404 or the core particles 404a including the second metal may be aggregated with each other while being applied with heat to form a particle connection layer. In this case, the particle connection layer has conductivity because the second particles 404 or the core particles 404a are not sintered with each other, but are aggregated in contact with each other and simply hardened. The adhesive material 40b may be positioned between the particles of the particle connection layer formed by the simple hardening as described above and on the surfaces of the particles. For reference, the particles forming the particle connection layer, the adhesive material 40b, etc., may be discriminated by looking at a cross-sectional shape, an outer shape, etc., in a micrograph or the like, or may be discriminated through the component analysis. In this case, when the second metal includes copper, the copper is easily aggregated by being applied with heat, and may effectively serve to transfer heat to the first metal by well containing heat.

The above-described hardening heat treatment process may be a light hardening heat treatment process or a heat hardening heat treatment process. In particular, when the hardening heat treatment process is performed as the light hardening heat treatment process, by passing light through the photoelectric converter in which the printed layer 420 is formed as a space to which light is irradiated, it is possible to simplify the process. By the light hardening heat treatment process, the temperature is raised to the temperature required for the hardening heat treatment process in a short time, and the compound layer 50 is formed while performing the hardening heat treatment process, so the low temperature process may be maintained while securing excellent resistance characteristics.

In the light sintering process, a xenon flash lamp may be used as a light source, an irradiation time may be 0.1 ms to 10 ms, and energy may be 1 J/cm$^2$ to 100 J/cm$^2$ (for example, 4 J/cm² to 10 J/cm²). In particular, it is possible to implement the desired temperature of the hardening heat treatment process at 4 J/cm² to 10 J/cm² (e.g., 500° C., or lower). Such a light source, irradiation time, and energy are limited to a range capable of maintaining a low-temperature process while having excellent resistance characteristics by raising the temperature to the desired hardening heat treatment process, but the present disclosure is not limited thereto. The above-described light source, irradiation time, energy, etc., may be variously changed in consideration of other conditions of the manufacturing process, material, structure, etc., of the solar battery 10.

As described above, when the electrodes 42 and 44 are formed using the printing process using the low-temperature electrode paste and the hardening heat treatment performed at a low temperature, the process of manufacturing the solar battery 10 may be implemented as the low-temperature process. Accordingly, it is possible to effectively prevent the damage to the polycrystalline semiconductor layer 30, the change in characteristics, the unwanted metal diffusion into the semiconductor substrate 12, and the like, which may occur in the high-temperature process.

The first paste for forming the first electrode 42 and the second paste for forming the second electrode 44 may be made of the same low-temperature electrode paste having the same material and the same composition. Then, the same low-temperature electrode paste may be used as the first and second pastes, thereby simplifying the process. Alternatively, the first paste and the second paste may be made of different materials or different pastes having different compositions. Various other modifications are possible.

Figure 7D:
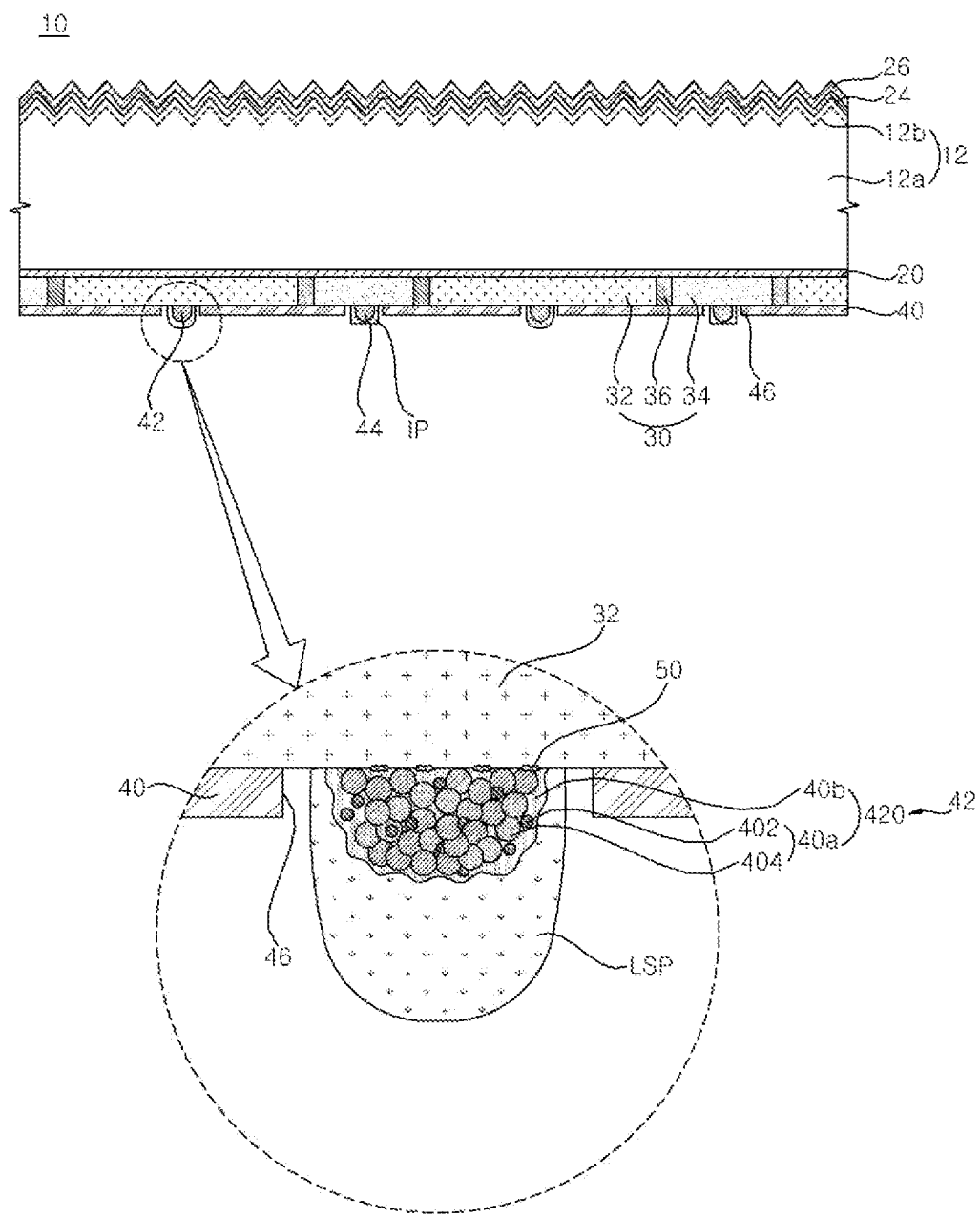

Then, as illustrated in FIG. 7D, the insulating member IP and the adhesive layer LSP are formed on the electrodes 42 and 44. The insulating member IP and/or the adhesive layer LSP may be formed to have the desired pattern by the printing process or the like. For example, the insulating material for forming the insulating member IP or the low-temperature solder paste for forming the adhesive layer LSP may be applied by screen printing using a mask. However, the present disclosure is not limited thereto.

The above-described low-temperature solder paste or the insulating material is applied to be positioned on the conductive regions 32 and 34 inside the contact hole 46 (for example, to be in contact with the conductive regions 32 and 34) to position the adhesive layer LSP or the insulating member IP only in the inside of the contact hole 46. However, the present disclosure is not limited thereto, and various modifications are possible. For example, the insulating member IP may be provided on the outside of the contact hole 46 (i.e., the back surface passivation film 40). After the printing process, the low-temperature solder paste or the adhesive layer LSP may have a shape that convexly protrudes toward the outside in the same way as the electrodes 42 and 44.

Here, the adhesive layer LSP may be formed using the low-temperature solder paste including a solder material, an additional adhesive material, a solvent, an additive, and the like. The low-temperature solder paste may include an additional adhesive material in a volume ratio of 40 to 55 parts by weight based on total 100 parts by weight before the adhesive heat treatment process. Accordingly, it is possible to stably temporarily fix the wiring material 142 on the electrodes 42 and 44. The solder material included in the adhesive layer LSP has been described in detail in the above description, and therefore, a detailed description thereof will be omitted.

The solder paste includes a solvent, but the solvent is volatilized during the heat treatment, so the adhesive layer LSP may not include the solvent or may be included in a very small amount. An organic solvent may be used as the solvent. For example, butyl carbitol acetate, cellulose acetate, or the like may be used. Various materials known as additives may be used. However, the present disclosure is not limited to materials such as the solvent and the additive.

As an example, the adhesive layer LSP may be formed after the insulating member IP is first formed. In this way, when the insulating member IP is formed first, even if defects occurs during the formation of the adhesive layer LSP, the electrical connection or the like may not occur in the portion where the electrical connection should not be made by the insulating member IP. However, the present disclosure is not limited thereto, and the adhesive layer LSP is formed and then the insulating member IP may be formed.

Figure 7E:
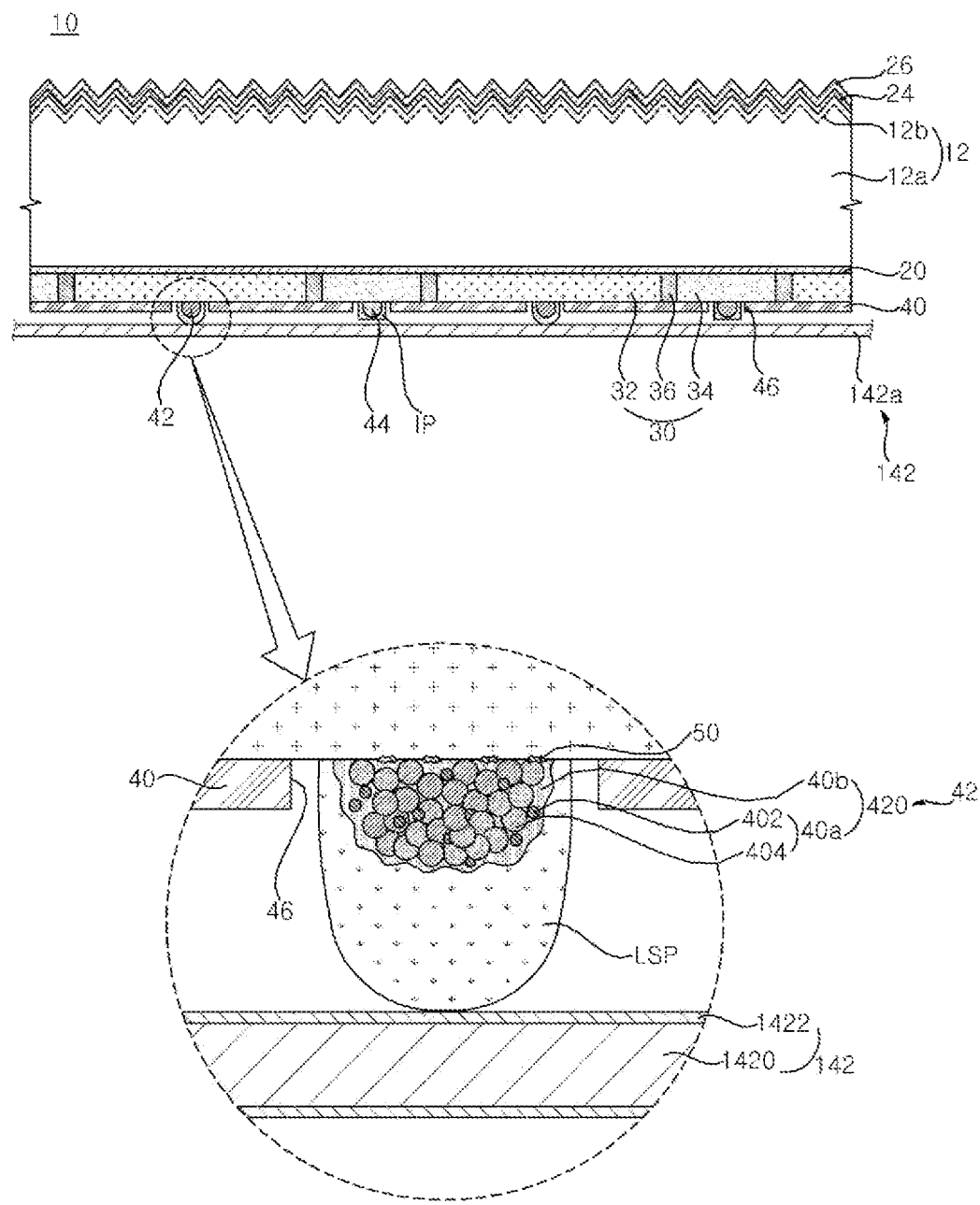

Then, as illustrated in FIG. 7E, the wiring material 142 is positioned on the electrodes 42 and 44, the insulating member IP, and the adhesive layer LSP. In this case, the wiring material 142 may be temporarily fixed in contact with the adhesive layer LSP.

Figure 7F:
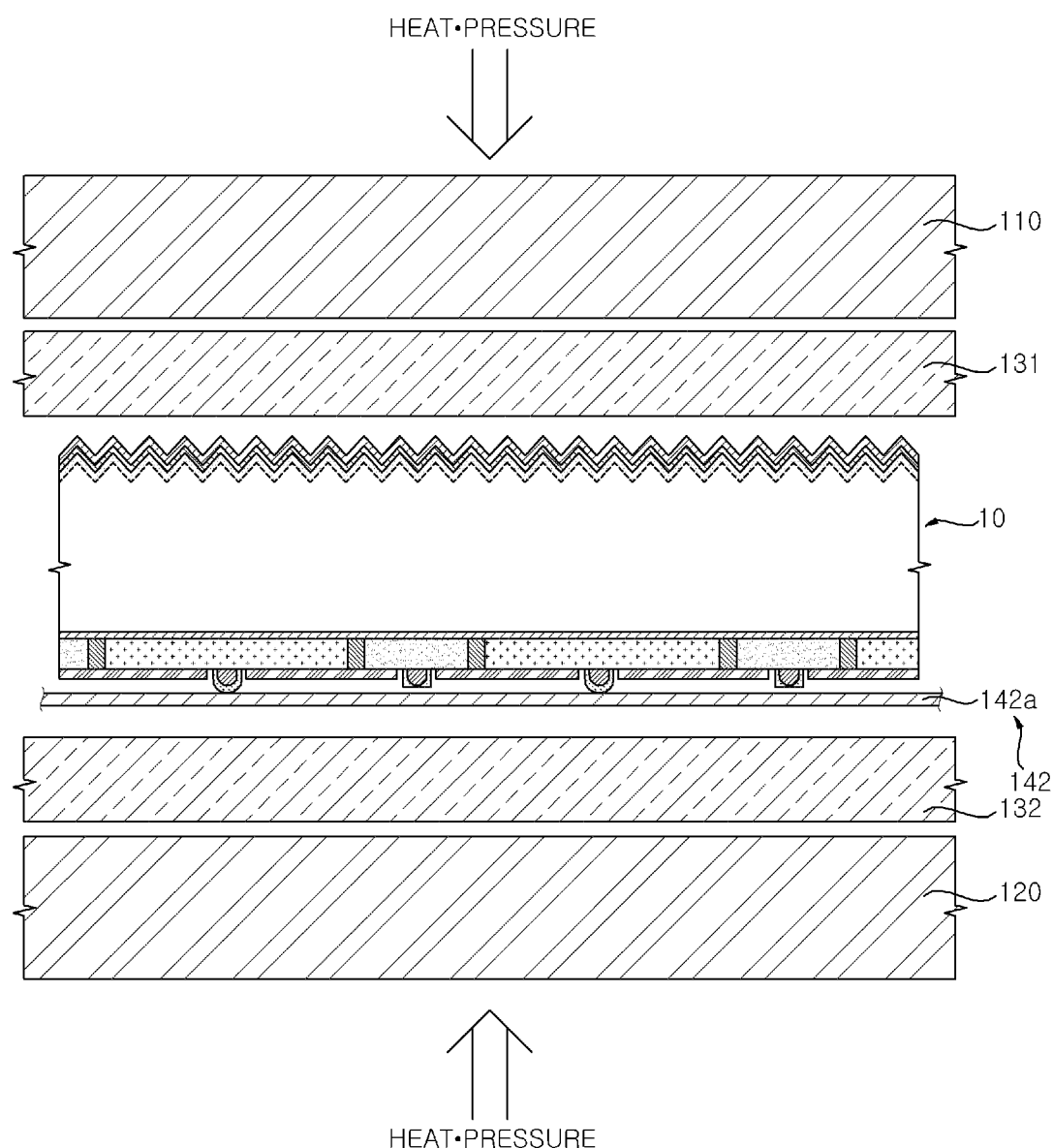
Figure 7G:
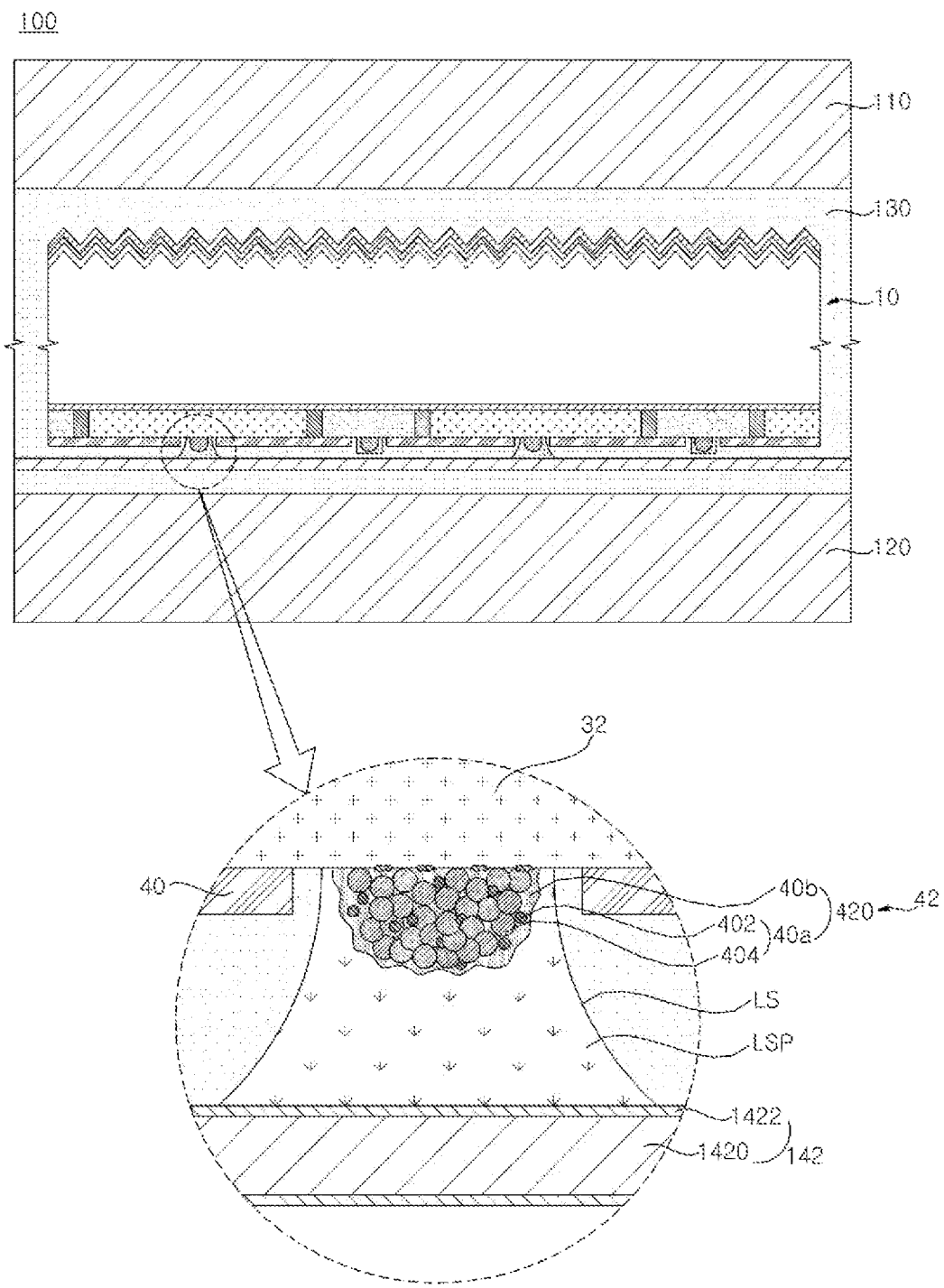

Subsequently, as illustrated in FIG. 7F, the lamination process may be performed to manufacture the solar battery panel 100 as illustrated in FIG. 7G. That is, as illustrated in FIG. 7F, the solar battery 10, the first and second sealing materials 131 and 132 to surround and seal the solar battery 10, and the first and second cover members 110 and 120 are stacked on a working stand of a lamination device to form the stacked structure. Here, the solar battery 10 may be in the form of the plurality of solar batteries 10 to which the wiring unit 140 is connected. For clear understanding. FIG. 7F illustrates that the first cover member 110, the first sealing material 131, the solar battery 10 to which the wiring material 140 is temporarily fixed, the second sealing material 132, and the second cover member 120 are spaced apart from each other, but in reality, the first cover member 110, the first sealing material 131, the solar battery 10, the second sealing member 132, and the second cover member 120 may be positioned while being in contact with each other. In addition, it has been illustrated that the second cover member 120 is positioned at the lower portion and the second sealing material 132, the solar battery 10, the first sealing material 131, and the first cover member 110 may be sequentially positioned over the second member 120, but they may be positioned in reverse.

In this state, the lamination process of applying the heat and pressure to the stacked structure integrates the solar battery 10, the sealing material 130, and the first and second cover members 110 and 120 to form the solar battery panel 100. As an example, air pressure may be used as the pressure. As a result, the lamination process may be performed without applying a large pressure to the solar battery 10 or the like. For example, the process temperature of the lamination process may be 250° C., or lower (for example, 100° C. to 150° C.).

The first and second sealing materials 131 and 132 are melted and hardened at the temperature of the lamination process and compressed by pressure to form the sealing material 130 integrated to surround the solar battery 10. The sealing material 130 may surround and seal the solar battery 10 while completely filling the space between the first cover member 110 and the second cover member 120. Then, the adhesive layer LSP between the electrodes 42 and 44 and the wiring material 142 is melted and then hardened and compressed by pressure to physically and electrically fix the electrodes 42 and 44 and the wiring material 142. As described above, in the present embodiment, the adhesive heat treatment process for bonding the wiring material 142 is simultaneously performed together in the lamination process, so the adhesive heat treatment process may not be performed separately. As a result, the process may be simplified. However, the present disclosure is not limited thereto, and an adhesive heat treatment process may be performed in advance before the lamination process. Various other modifications are possible.

According to the present embodiment, the electrodes 42 and 44 having excellent characteristics in the solar battery 10 having the polycrystalline semiconductor layer 30 are formed by the printing process (e.g., one-time printing process), so the solar battery 10 having excellent characteristics may be achieved by a simple process. In addition, the process of manufacturing the solar battery panel 100 having excellent characteristics may be greatly simplified by directly positioning the adhesive layer LSP and the wiring material 142 on the electrodes 42 and 44 and performing the adhesive heat treatment process.

Hereinafter, a solar battery, a solar battery panel, and a method for manufacturing the same according to another embodiment of the present disclosure will be described in detail. A detailed description of the same or extremely similar parts as or to the above description will be omitted and only different parts will be described in detail. The above-described embodiment or a modified example thereof and a combination of the following embodiment or the modified examples thereof also fall within the scope of the present disclosure.

Figure 8:
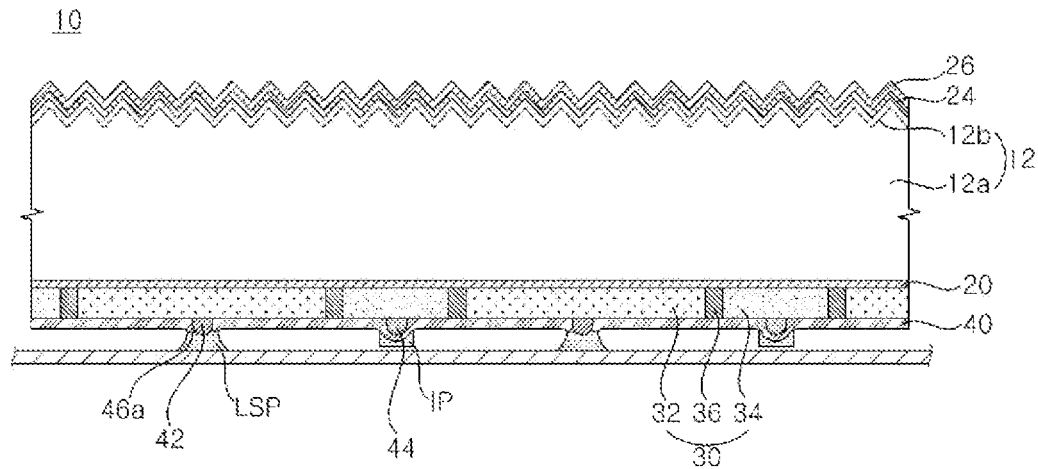
FIG. 8 is a partial cross-sectional view illustrating a solar battery, an adhesive layer and an insulating member, and a wiring material included in a solar battery panel according to another embodiment of the present disclosure.

FIG. 8 is a partial cross-sectional view illustrating a solar battery, an adhesive layer and an insulating member, and a wiring material included in a solar battery panel according to another embodiment of the present disclosure. FIG. 8 illustrates a part corresponding to FIG. 4.

Referring to FIG. 8, in the present embodiment, the back surface passivation film 40 may further include a first part that is formed on the polycrystalline semiconductor layer 30 (i.e., the first conductive region 32, the second conductive region 34, the barrier region 36, etc.) and a second part that is positioned on the electrodes 42 and 44. More specifically, the first part of the back surface passivation film 40 may be entirely formed in a portion where the electrodes 42 and 44 are not formed on the surface of the polycrystalline semiconductor layer 30 opposite to the semiconductor substrate 12. In addition, the second part of the back surface passivation film 40 may be partially or entirely formed on the surfaces of the semiconductor substrate 12 and the electrodes 42 and 44.

The back surface passivation film 40 may be a film formed after the electrodes 42 and 44 are formed. Accordingly, in the present embodiment, the back surface passivation film 40 may not be positioned between the polycrystalline semiconductor layer 30 and the electrodes 42 and 44. The back surface passivation film 40 should be formed on the electrodes 42 and 44 and may be formed of as a single layer in consideration of the electrical connection characteristics between the electrodes 42 and 44 and the adhesive layer LSP. For example, the back surface passivation film 40 may be formed of a single-layer reflective film, a single-layer anti-reflection film, and the like.

FIG. 8 illustrates that a contact hole 46a exposing the electrodes 42 and 44 is partially formed to correspond to the portion where the adhesive layer LSP is formed in the second part of the back surface passivation film 40 so that the electrodes 42 and 44 and the adhesive layer LSP are indirect contact with each other. The contact hole 46a may be formed by the adhesive heat treatment process of the wiring material 142 without a separate forming process. Accordingly, the contact hole 46a is provided to improve the electrical connection characteristics and the adhesive properties between the electrodes 42 and 44 and the adhesive layer LSP, and the process of forming the contact hole 46a may be omitted. Accordingly, the damage to the solar battery 10 or the deterioration in characteristics of the solar battery 10 that may have occurred in the process of forming the contact hole 46a may be prevented, and the manufacturing process may be simplified.

The solar battery 10 and the method for manufacturing a solar battery panel 100 including the same will be described with reference to FIGS. 9A to 9E as follows. FIGS. 9A to 9E are cross-sectional views illustrating a solar battery and a method for manufacturing a solar battery panel including the same according to an embodiment of the present disclosure. FIG. 9 illustrates a part corresponding to FIG. 4.

Figure 9A:
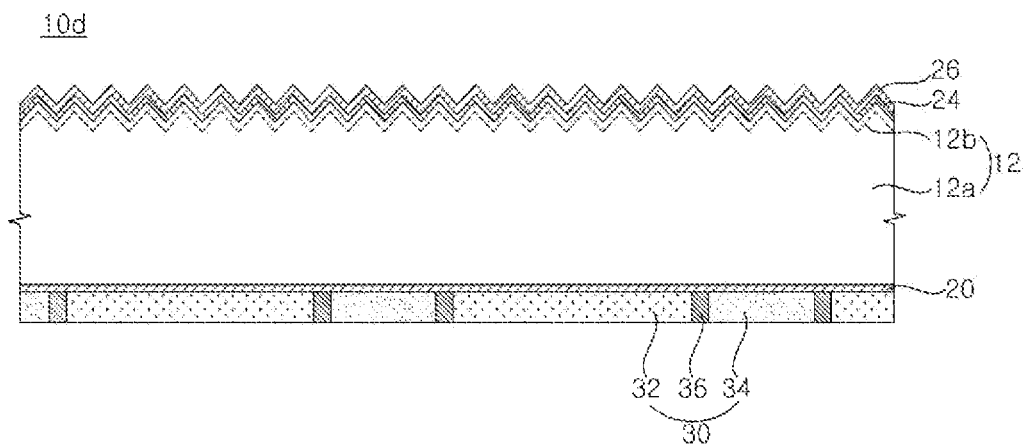
FIGS. 9A to 9E are cross-sectional views illustrating a solar battery and a method for manufacturing a solar battery panel including the same according to an embodiment of the present disclosure.

As illustrated in FIG. 9A, the intermediate layer 20, the first conductive region 32, the second conductive region 34, the barrier region 36 (or polycrystalline semiconductor layer 30), or the like may be formed on the back surface of the semiconductor substrate 12, and the front electric field region 12b, the front passivation film 24, the anti-reflection film 26, and the like may be formed on the front surface of the semiconductor substrate 12 to form a photoelectric converter 10d. Here, the photoelectric converter 10d is in a state in which the back surface passivation film 40 and the electrodes 42 and 44 are not formed. For a method for manufacturing a photoelectric converter 10d, the description with reference to FIG. 7A may be applied as it is, except for the description of the back surface passivation film 40.

Figure 9B:
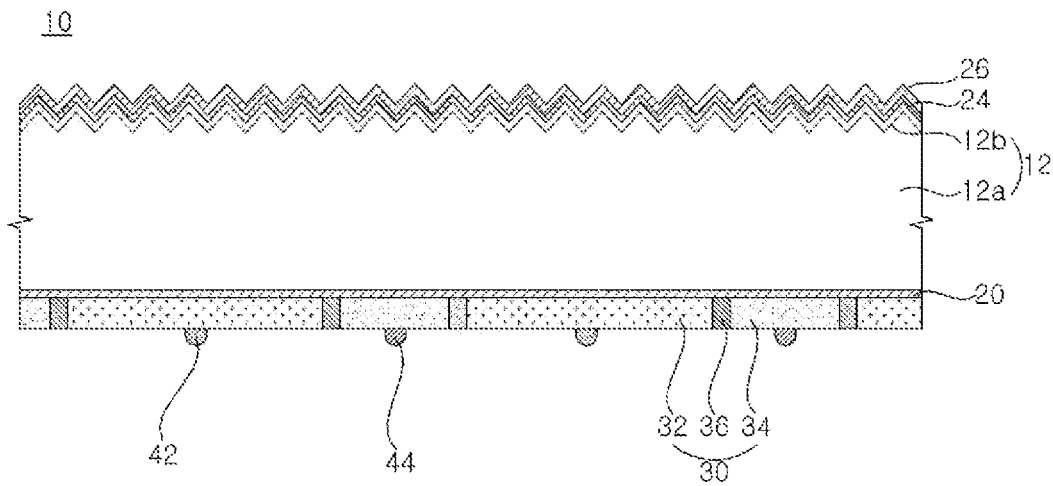

Then, as illustrated in FIG. 9B, the electrodes 42 and 44 connected to the conductive regions 32 and 34 may be formed. In this case, the compound layer 50 made of the metal-semiconductor compound is formed together between the conductive regions 32 and 34 and the electrodes 42 and 44. In this regard, the descriptions of the electrodes 42 and 44 and the compound layer 50 with reference to FIG. 7C may be applied as they are, except for the contact hole 46.

Figure 9C:
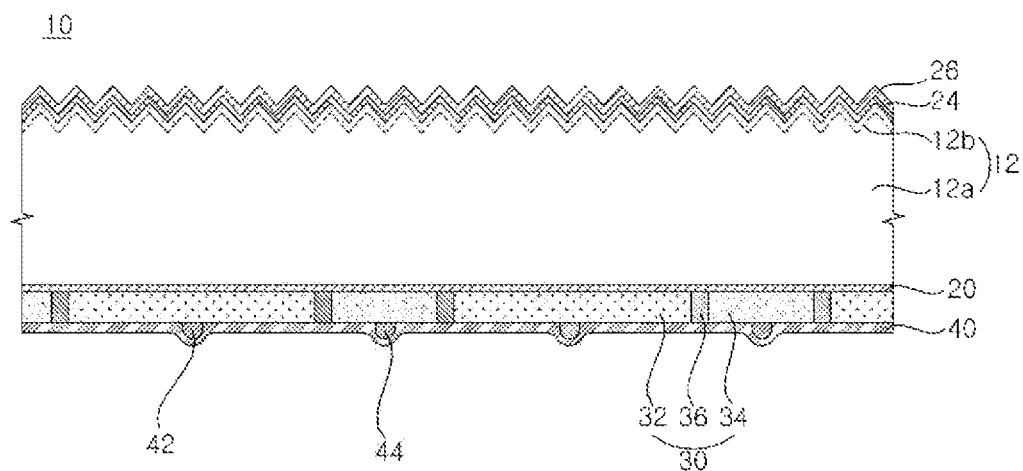

Subsequently, as illustrated in FIG. 9C, the back surface passivation film 40 may be formed to cover the polycrystalline semiconductor layer 30 and the electrodes 42 and 44. More specifically, the back surface passivation film 40 may be formed while entirely covering the surface of the polycrystalline semiconductor layer 30 and the electrodes 42 and 44 away from the semiconductor substrate 12. As the method for forming a back surface passivation film 40, the method for forming a back surface passivation film 40 with reference to FIG. 7A may be applied as it is.

Although FIGS. 8 and 9C illustrate that the back surface passivation film 40 is formed on the electrodes 42 and 44, the present disclosure is not limited thereto. Accordingly, the back surface passivation film 40 is not entirely or partially formed on the electrodes 42 and 44, or the thickness of the portion formed on the electrodes 42 and 44 may be thinner or more non-uniform than the portion formed on the polycrystalline semiconductor layer 30 on which the electrodes 42 and 44 are not formed.

Figure 9D:
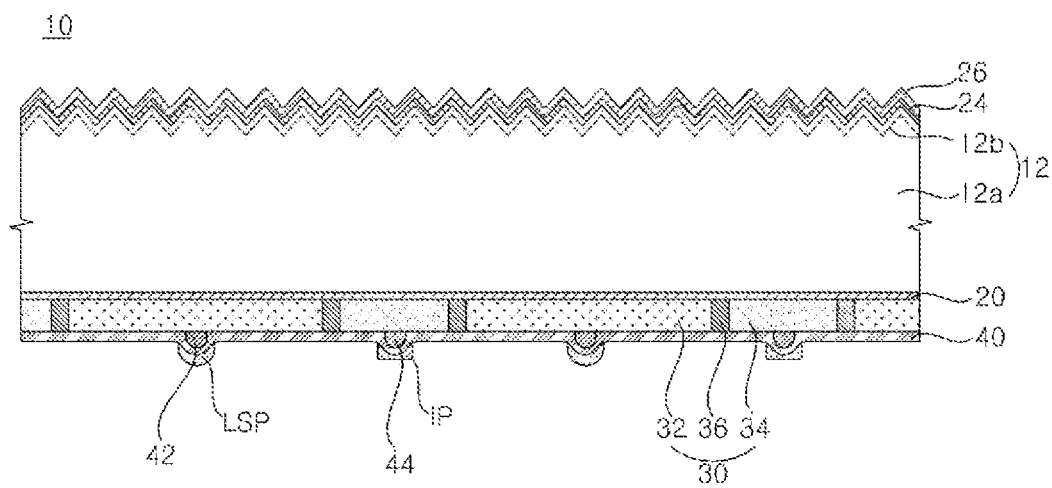

Next, as illustrated in FIG. 9D, the adhesive layer LSP is formed so as to correspond to the electrodes 42 and 44.

FIG. 9D illustrates that the adhesive layer LSP is formed on the back surface passivation film 40 positioned on the electrodes 42 and 44. However, the present disclosure is not limited thereto. For example, when the passivation film 40 is not formed on the electrodes 42 and 44, the adhesive layer LSP may be formed by contacting at least a portion of the electrodes 42 and 44. Alternatively, the adhesive layer LSP may be formed by contacting at least a portion of the electrodes 42 and 44 by performing a process of separately forming a contact hole corresponding to a portion where the adhesive layer LSP is to be formed.

FIG. 9D illustrates that the insulating member IP is formed in the overlapping portion of the electrodes 42 and 44 that are not to be connected and the wiring material 142. As a result, it is possible to improve the insulating properties by the insulating member IP. However, the present disclosure is not limited thereto. For example, the insulating member IP may not be formed on the overlapping portion of the electrodes 42 and 44 that are not to be connected and the wiring material 142. This is because the insulating properties may be maintained by the back surface passivation film 40. As a result, it is possible to reduce costs and simplify the process by omitting the process of forming the insulating member IP.

For the adhesive layer LSP and/or the insulating member IP, the description of the adhesive layer LSP and/or the insulating member IP with reference to FIG. 7D may be applied as it is.

Figure 9E:
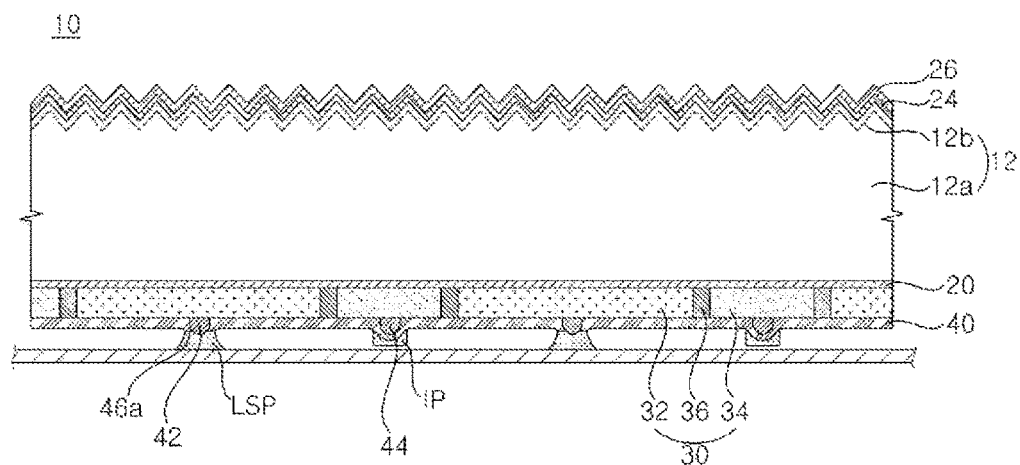

Next, as illustrated in FIG. 9E, the wiring material 142 is positioned (e.g., temporarily fixed) on the electrodes 42 and 44, the insulating member IP, and the adhesive layer LSP, and the adhesive heat treatment process may be performed to electrically and physically connect the wiring material 142 to the adhesive layer LSP. As the adhesive heat treatment process, the lamination process may be used with reference to FIGS. 7F and 7G, but the present disclosure is not limited thereto. For the adhesive heat treatment process and/or the lamination process, the description of the adhesive heat treatment process and/or the lamination process with reference to FIGS. 7F and 7G may be applied as it is. The description of the adhesive layer LSP with reference to FIG. 7G may also be applied to the shape of the adhesive layer LSP after the adhesive heat treatment process.

In the adhesive heat treatment process, the contact hole 46a may be formed in a portion of the back surface passivation film 40 in the portion positioned between the adhesive layer LSP and the electrodes 42 and 44 by the pressure applied to the adhesive layer LSP and the wiring material 142. As a portion of the back surface passivation film 40 positioned on the electrodes 42 and 44 is ruptured by the heat and pressure, the contact hole 46a may be formed. Since the portion of the back surface passivation film 40 formed on the electrodes 42 and 44 may be formed to be thinner or unstable than other portions, the contact hole 46a may be easily formed. Accordingly, the electrodes 42 and 44 and the adhesive layer LSP may be in contact and electrically connected to each other. In this case, the contact hole 46a may be partially formed instead of entirely formed on the surfaces of the electrodes 42 and 44 opposite to the semiconductor substrate 12. As a result, a portion of the back surface passivation film 40 may remain and be positioned on the surfaces of the electrodes 42 and 44 opposite to the semiconductor substrate 12. However, the present disclosure is not limited thereto. Since the contact hole 46a is not formed in the back surface passivation film 40 positioned on the electrodes 42 and 44, the electrodes 42 and 44 and the adhesive layer LSP may be positioned with the back surface passivation film 40 interposed therebetween. Even in this case, the electrical connection may be possible due to a thin thickness of the back surface passivation film 40. Alternatively, the contact hole 46a may be formed entirely on the surfaces of the electrodes 42 and 44 opposite to the semiconductor substrate 12. Various other modifications are possible.

In the above-described embodiments, it has been illustrated that the electrodes 42 and 44 are positioned in contact with the conductive regions 32 and 34. However, the present disclosure is not limited thereto. Accordingly, the insulating film may be positioned between the conductive regions 32 and 34 and the electrodes 42 and 44 so that the electrodes 42 and 44, the insulating film, and the conductive regions 32 and 34 form a metal-insulating layer-semiconductor (MIS) structure. As a result, the deterioration in characteristics of the passivation, the damage to the conductive regions 32 and 34, and the like may be prevented, and the interface contact properties may be improved. In the present embodiment, the insulating film may be formed of a refractory metal oxide film (e.g., titanium oxide film, molybdenum oxide film) formed by bonding a refractory metal and oxygen. In this case, in the above-described embodiment, the electrodes 42 and 44 or the adhesive layer LSP formed in contact with the conductive regions 32 and 34 may be understood as being positioned in the conductive regions 32 and 34 with the electrodes 42 and 44 interposed therebetween.

Hereinafter, the present disclosure will be described in more detail by an experimental example of the present disclosure. However, the experimental example of the present disclosure is only to illustrate the present disclosure, and the present disclosure is not limited thereto.

Example 1

An intermediate layer including silicon oxide and a polycrystalline semiconductor layer including polycrystalline silicon are sequentially formed on a back surface of a semiconductor substrate. First and second conductive regions were formed by doping the polycrystalline semiconductor layer, and an electric field region is formed by doping the entire surface of the semiconductor substrate. A front passivation film made of an insulating material was formed on a front surface of the semiconductor substrate by deposition, and a back surface passivation film made of the insulating material was formed on a back surface of the semiconductor substrate by the deposition. A contact hole was formed in a back surface passivation film using a laser, and first and second electrodes electrically connected to the first and second conductive regions were formed. The first and second electrodes were formed to have a thickness of 20 µm by applying a low-temperature electrode paste containing nickel, copper, an adhesive material, and a solvent through a printing process and performing drying and heat treatment on the low-temperature electrode paste at 300° C. A ratio of an area of the first and second electrodes to an area of the solar battery was 50%. In this way, the plurality of solar batteries were manufactured.

Comparative Example 1

A plurality of solar batteries were manufactured in the same method as in Example 1 except that first and second electrodes are sputtering electrodes formed using a sputtering process and have a thickness of 500 nm and a ratio of an area of the first and second electrodes to an area of the solar battery is 80%.

Average values of resistivity, contact resistance, and series resistance of the electrode in a plurality of solar batteries according to Example 1 and Comparative Example 1 were shown in Table 1 as relative values. In Table 1, the average values of the resistivity, the contact resistance, and the series resistance of Example 1 were described with the average values of resistivity, contact resistance, and series resistance of Comparative Example 1 being 100%. Here, the lower the average values of the resistivity, the contact resistance, and the series resistance, the lower the resistance value, so the excellent resistance characteristics were obtained.

TABLE 1

|                    | Example 1 | Comparative Example 1 |
|--------------------|-----------|------------------------|
| Resistivity        | 151%      | 100%                   |
| Contact resistance | 105%      | 100%                   |
| Serial resistance  | 76%       | 100%                   |

It can be seen that the contact resistance of the electrode according to Example 1 is similar to the contact resistance of the electrode according to Comparative Example 1 to maintain an excellent level. Although the resistivity of the electrode according to Example 1 is greater than the resistivity of the electrode according to Comparative Example 1, the series resistance of the electrode according to Example 1 is smaller than that of the electrode according to Comparative Example 1, so it can be seen that the electrode according to Example 1 has excellent resistance characteristics. This is because, in order to form the electrode according to Example 1 to a sufficient thickness to have a sufficient cross-sectional area, the series resistance directly related to the carrier collection characteristic may be made lower than that of Comparative Example 1 even though the resistivity is low.

Figure 10:
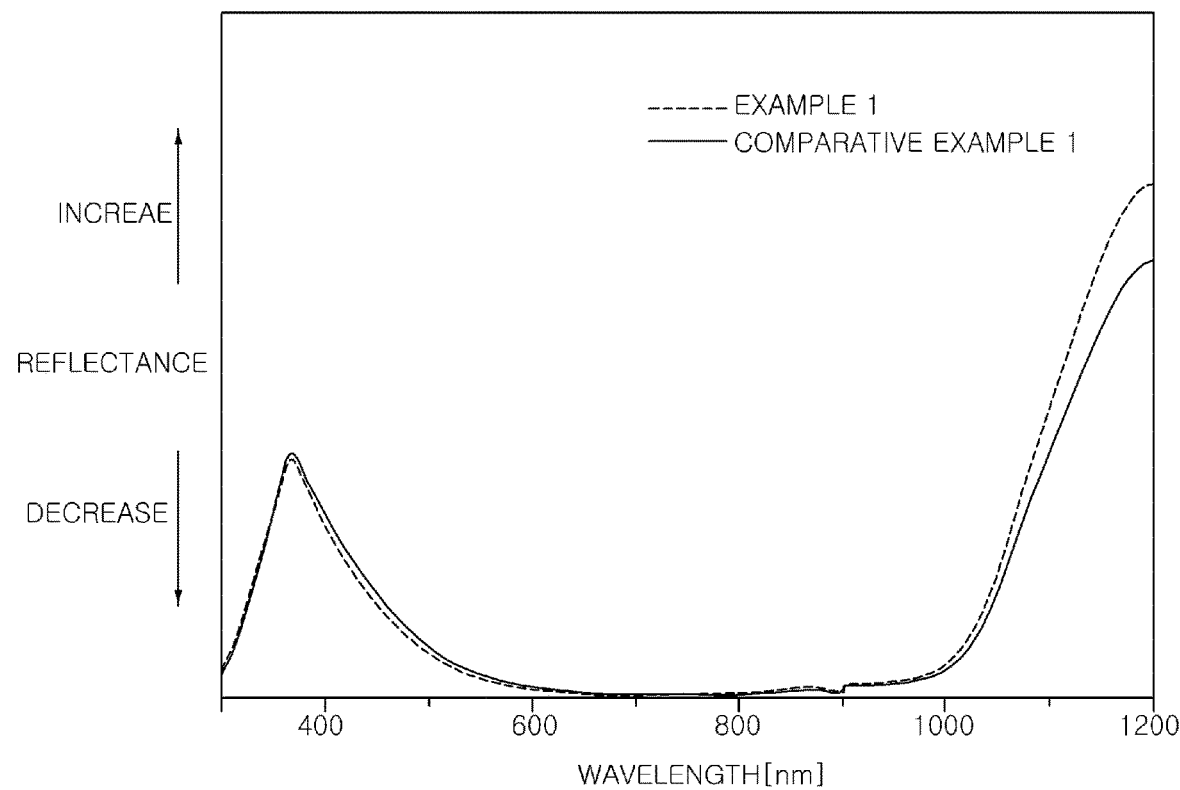
FIG. 10 is a graph of measuring reflectance according to a wavelength of light from a back surface of a solar battery according to Example 1 and Comparative Example 1.

FIG. 10 illustrates a graph of measuring reflectance according to a wavelength of light from the back surface of the solar battery according to Example 1 and Comparative Example 1. The reflectance on the back surface of the solar battery according to Example 1 and Comparative Example 1 was calculated, and the results are shown in Table 2. Table 2 showed the internal reflectance of Example 1 with the internal reflectance of Comparative Example 1 being 100%.

TABLE 2

|            | Example 1 | Comparative Example 1 |
|------------|-----------|------------------------|
| Reflectance| 103%      | 100%                   |

Referring to FIG. 10 and Table 2, it can be seen that the reflectance of the solar battery according to Example 1 is higher than that of the solar battery according to Comparative Example 1. This is predicted that this is because, in Example 1, the ratio of the area of the electrode to the area of the solar battery was lowered to induce sufficient light path control (i.e., internal reflection) by the back surface passivation film.

Features, structures, effects, etc., according to the above description are included in at least one embodiment of the present disclosure, and are not necessarily limited only to one embodiment. Furthermore, features, structures, effects, etc., illustrated in each embodiment may be practiced by being combined or modified for other embodiments by those of ordinary skill in the art to which the embodiments pertain. Accordingly, the contents related to such combinations and modifications should be interpreted as being included in the scope of the present disclosure.

The invention claimed is:

1. A solar battery, comprising:
a semiconductor substrate;
a conductive region positioned on one surface of the semiconductor substrate and including a polycrystalline semiconductor layer;
an electrode connected to the conductive region including the polycrystalline semiconductor layer and including a metal and an adhesive material;
a back surface passivation film covering the conductive region and defining a contact hole, the electrode being formed inside the contact hole to be spaced apart from the back surface passivation film; and
an adhesive layer positioned between the electrode and a wiring material to electrically connect the electrode and the wiring material,
wherein the adhesive layer includes a solder material and an additional adhesive material that is different than the adhesive material, and
wherein the electrode protrudes to be rounded or convexed toward the wiring material to form a rounded or convexed portion, and a width of the adhesive layer gradually increases toward the wiring material while completely covering the rounded or convexed portion of the electrode, and
wherein the adhesive layer includes a margin portion that is positioned outside the electrode, that is in direct contact with the conductive region, and that is spaced apart from the back surface passivation film.

2. The solar battery of claim 1, wherein the metal includes a first metal, and a compound layer including a metal-semiconductor compound made of the first metal and a semiconductor material included in the polycrystalline semiconductor layer is partially formed to correspond to a first region at a boundary between the electrode and the conductive region.

3. The solar battery of claim 2, wherein the metal and the adhesive material are formed in contact with the polycrystalline semiconductor layer in a second region excluding the first region at the boundary between the electrode and the conductive region.

4. The solar battery of claim 2, wherein the first metal includes nickel, the semiconductor material includes silicon, and the compound layer includes nickel silicide.

5. The solar battery of claim 3, wherein an area of the first region is smaller than that of the second region.

6. The solar battery of claim 2, wherein the metal further includes a second metal having a lower resistivity than the first metal.

7. The solar battery of claim 2, wherein a part by weight of the first metal is 15 or less based on total 100 parts by weight of the metal in the electrode.

8. The solar battery of claim 1, wherein the electrode includes a single printed layer including the metal and the adhesive material.

9. The solar battery of claim 8, wherein a thickness of the electrode or the single printed layer is 10 μm or more.

10. The solar battery of claim 1, wherein the conductive region includes a first conductive region and a second conductive region spaced apart from each other on the one surface of the semiconductor substrate,
the electrode includes a first electrode connected to the first conductive region and a second electrode connected to the second conductive region, and
at least one of the first electrode and the second electrode includes the metal and the adhesive material.

11. The solar battery of claim 1, wherein the solder material includes bismuth.

12. The solar battery of claim 1, wherein the additional adhesive material includes an organic material.

13. The solar battery of claim 1, wherein the adhesive material includes a first material, and the additional adhesive material includes a second material that is removed in greater quantities than the first material during a hardening heat treatment or an adhesive heat treatment.

14. The solar battery of claim 1, wherein a part by weight of the adhesive material included in the electrode is greater than that of the additional adhesive material included in the adhesive layer.

* * * * *